(12) United States Patent
Berges Gonzalez et al.

(10) Patent No.: US 9,104,189 B2
(45) Date of Patent: Aug. 11, 2015

(54) METHODS AND APPARATUSES FOR MONITORING ENERGY CONSUMPTION AND RELATED OPERATIONS

(76) Inventors: Mario E. Berges Gonzalez, Pittsburgh, PA (US); Ethan J. Goldman, Berlington, VT (US); Luciio Soibelman, Pittsburgh, PA (US); Burton W. Andrews, Pittsburgh, PA (US); Diego S. Benitez Meijia, Pittsburgh, PA (US); H. Scott Matthews, Pittsburgh, PA (US); Michael Hoynck, Pittsburgh, PA (US)

( * ) Notice: Subject to any disclaimer, the term of this patent is extended or adjusted under 35 U.S.C. 154(b) by 689 days.

(21) Appl. No.: 13/381,471

(22) PCT Filed: Jun. 29, 2010

(86) PCT No.: PCT/US2010/040300
§ 371 (c)(1),
(2), (4) Date: Apr. 27, 2012

(87) PCT Pub. No.: WO2011/002735
PCT Pub. Date: Jan. 6, 2011

(65) Prior Publication Data
US 2012/0290230 A1    Nov. 15, 2012

Related U.S. Application Data

(60) Provisional application No. 61/222,247, filed on Jul. 1, 2009.

(51) Int. Cl.
*G06F 19/00* (2011.01)
*G05B 19/042* (2006.01)
*G01D 4/00* (2006.01)
*G01R 19/25* (2006.01)
*H02J 3/14* (2006.01)

(52) U.S. Cl.
CPC ............ *G05B 19/0428* (2013.01); *G01D 4/004* (2013.01); *G01R 19/2506* (2013.01); *G05B 2219/2639* (2013.01); *G05B 2219/2642* (2013.01); *H02J 3/14* (2013.01); *H02J 2003/143* (2013.01); *Y02B 70/3241* (2013.01); *Y02B 70/3266* (2013.01); *Y02B 90/242* (2013.01); *Y02B 90/245* (2013.01); *Y04S 20/227* (2013.01); *Y04S 20/242* (2013.01); *Y04S 20/322* (2013.01); *Y04S 20/38* (2013.01); *Y04S 20/40* (2013.01)

(58) Field of Classification Search
CPC .......................... C08L 23/0815; C08F 210/18
USPC ............................ 702/61, 64, 182–185, 188
See application file for complete search history.

(56) References Cited

U.S. PATENT DOCUMENTS

| | | |
|---|---|---|
| 2006/0036403 A1 | 2/2006 | Wegerich et al. |
| 2006/0259249 A1 | 11/2006 | Sampath et al. |
| 2009/0031018 A1 | 1/2009 | Conkright et al. |
| 2009/0228224 A1 * | 9/2009 | Spanier et al. .................. 702/60 |
| 2009/0307178 A1 | 12/2009 | Kuhns et al. |

OTHER PUBLICATIONS

Paris, James A., A Framework for Non-Intrusive Load Monitoring and Diagnostics, MIT PhD Dissertation, Feb. 2006.
Shaw, S. R. , et al., Non-Intrusive Load Monitoring and Diagnostics in Power Systems, IEE Trans. on Instrumentation and Measuremenmt, Jul. 2008.

* cited by examiner

*Primary Examiner* — Edward Raymond
(74) *Attorney, Agent, or Firm* — Fox Rothschild LLP; Dennis M. Carleton

(57) ABSTRACT

Apparatus and method including acquiring a signal indicative of power consumption; detecting a transient in the signal; extracting a feature indicative of the transient, wherein extracting the feature includes: fitting a plurality of models to the transient, selecting one of the plurality of models as a model for the transient, and defining the feature indicative of the transient based on at least one parameter of the model for the transient; and classifying the transient based on the feature.

23 Claims, 18 Drawing Sheets

METHODS AND APPARATUSES FOR MONITORING ENERGY CONSUMPTION AND RELATED OPERATIONS

CROSS-REFERENCE TO RELATED APPLICATIONS

This application claims benefit from U.S. provisional patent application Ser. No. 61/222,247, filed Jul. 1, 2009 and which is incorporated herein by reference. This application is also related to U.S. patent application Ser. No. 12/639,472, filed Dec. 16, 2009.

STATEMENT REGARDING FEDERALLY-SPONSORED RESEARCH AND DEVELOPMENT

Not Applicable.

FIELD OF THE INVENTION

The present invention is directed generally to methods and apparatuses for monitoring energy consumption and for related operations and, more specifically, for monitoring of energy consumption in buildings and providing consumption awareness to users and building management systems with the purpose of enabling better energy management decisions.

BACKGROUND OF THE INVENTION

The price and consumption of energy throughout the world has been increasing dramatically over recent years and is expected to continue along this trend in the years to come. According to the 2008 U.S. Department of Energy Annual Energy Outlook, residential energy consumption is expected to increase by approximately one percent per year for the next 20 years while energy prices slowly rise (See, Annual Energy Outlook, US Department of Energy, http://www.eia.doe.gov/oiaf/aeo/). Residential-related carbon dioxide emissions are also expected to increase. These trends clearly indicate the need for building technology solutions that lessen energy consumption. To achieve this goal, appliances or devices can be replaced with more energy efficient alternatives, building occupants or owners can alter their behavior to reduce the use of energy-consuming devices, or automated building management solutions can control the operation of devices in the building so as to achieve less energy consumption or schedule operation for non-peak demand periods to reduce energy costs. All of these approaches must be based on detailed knowledge of the amount of energy consumed by devices currently in the building and their corresponding periods of operation so that appropriate decisions can be made about how to reduce this consumption. Therefore, measurement is necessary for awareness.

A number of systems exist for measuring energy consumption in a building and reporting this to users. See, for example, D. Parker, D. Hoak, A. Meier, R. Brown, "How much energy are we using? Potential of residential energy demand feedback devices", Proc. Summer Study on Energy Efficiency in Buildings, 2006. However, these systems typically only report the total amount of electricity consumption for the entire building to the user. To obtain truly detailed information that is most informative for determining how to achieve energy savings, the user must manually switch devices on and off and note the change in the total consumption report. Most current systems lack any disaggregated reporting of the overall consumption and use-patterns of individual devices and appliances. Some exceptions are systems that use separate measurement devices to measure the electricity consumption of, for example, a sub-circuit of the building, an individual wall outlet or even an individual device itself. However, use of multiple metering devices distributed throughout the building to achieve this type of feedback is both costly and cumbersome to install.

As an alternative, the concept of non-intrusive load monitoring is known. See, for example, G. W. Hart, Nonintrusive appliance load monitoring, Proceedings of the IEEE, vol. 80, no. 12, pp. 1870-1891, 1992. See also U.S. Pat. No. 4,858,141, issued to Hart et al. Further improvements have been made in this area, particularly by Leeb. See for example, C. Laughman, K. Lee, R. Cox, S. Shaw, S. Leeb, L. Norford, P. Armstrong, Power signature analysis, IEEE Power and Energy Magazine, vol. 1, no. 2, pp. 56-63, 2003. See also U.S. Pat. No. 5,483,153 (issued to Leeb, et al), U.S. Pat. No. 7,043,380 (issued to Rodenberg, et al), U.S. Pat. No. 6,993,417 (issued to Osann, Jr.), U.S. Pat. No. 5,337,013 (issued to Langer et al), U.S. Pat. No. 5,717,325 (issued to Leeb, et al), and U.S. Pat. No. 6,993,417 (issued to Osann, Jr.). However, applicability and implementation of these previous techniques to real building environments with numerous devices operating in parallel has been minimally studied.

Non-Intrusive Load Monitoring (NILM) derives its name from the fact that, from the perspective of the electric utility company, the technique is able to monitor individual loads in a building without intruding (e.g., placing sensors or other devices) into the customer's property. As described above, this approach, also referred to as NIALM (Non-Intrusive Appliance Load Monitoring), has been studied extensively for the past two decades by researchers around the world, yielding promising results. Although the prior art results obtained so far are or may be applicable to many loads present in modern buildings, the prior art has failed to overcome the main issues that have been keeping the technology in the laboratory rather than being adopted by society: automatic training of the algorithms, effective user feedback, etc. Additionally, there is little research showing test results involving modern real world buildings, and even fewer experimentation addressing the possible energy savings that the approach could bring in the short, medium, or long term. Furthermore, with the ever-more widespread availability of the so-called "Smart Meters", there is a new opportunity to obtain power metrics without having to install custom hardware in buildings.

Hart [George W. Hart, Jr. Edward C. Kern, and Fred C. Schweppe. U.S. Pat. No. 4,858,141-non-intrusive appliance monitor apparatus, August 1989], [G. W. Hart. Nonintrusive appliance load monitoring. Proceedings of the IEEE, 80(12): 1870-1891, 1992], [G. W. Hart. Nonintrusive appliance load monitoring. Proceedings of the IEEE, 80(12):1870-1891, 1992.], was one of the first researchers to publish in the area. His early publications described a method for utilizing normalized real and reactive power (P and Q, respectively) measurements from the main electrical feed of a residential building. His technique relied on steady state power metrics (i.e., disregarding any transient, non-stable state) to describe in a distinct way the power draw of most home appliances of the time. In other words, when an individual appliance changed its state from off to on, for example, the change in the total real- and reactive-power of the house would be almost unique for the mentioned appliance. Hart referred to these changes as the appliance's signature, and described methods for correcting possible overlaps in this signature space by making use of appliance state transition models (e.g., an appliance cannot go from off to on and then again to on).

Norford and Leeb improved on Hart's technique by analyzing the startup transients of appliances [Leslie K. Norford and Steven B. Leeb. Non-intrusive electrical load monitoring in commercial buildings based on steady-state and transient load-detection algorithms. Energy and Buildings, 24(1):51-64, 1996.] and introducing better algorithms for detecting when state transitions have occurred [Dong Luo, Leslie Norford, Steven Shaw, and Steven Leeb. Monitoring HVAC equipment electrical loads from a centralized location—methods and field test results. ASHRAE Transactions, 108 (1):841-857, 2002.]. In [C. Laughman, Kwangduk Lee, R. Cox, S. Shaw, S. Leeb, L. Norford, and P. Armstrong. Power signature analysis. Power and Energy Magazine, IEEE, 1(2): 56-63, 2003] investigators describe how the use of current harmonics can improve the process even further, allowing for the detection and classification of certain continuously variable loads. Moreover, [W. Wichakool, A.-T. Avestruz, R. W. Cox, and S. B. Leeb. Resolving power consumption of variable power electronic loads using nonintrusive monitoring. In Power Electronics Specialists Conference, 2007. PESC 2007. IEEE, pages 2765-2771, 2007] presents further improvements to the solution for the problem of variable power electronics by using a spectral estimation method and a switching function technique. A summary and presentation of the latest achievements in this line of work can be found in [S. R. Shaw, S. B. Leeb, L. K. Norford, and R. W. Cox. Nonintrusive load monitoring and diagnostics in power systems. Instrumentation and Measurement, IEEE Transactions on, 57(7):1445-1454, 2008].

Other research has focused on utilizing the technique for monitoring the health of large appliances, by carefully analyzing any changes to its startup transient and associated signature [James Paris. A framework for non-intrusive load monitoring and diagnostics. Thesis, Massachusetts Institute of Technology, 2006. Thesis M. Eng.—Massachusetts Institute of Technology, Dept. of Electrical Engineering and Computer Science, 2006], [R. Cox, S. B. Leeb, S. R. Shaw, and L. K. Norford. Transient event detection for nonintrusive load monitoring and demand side management using voltage distortion. In Applied Power Electronics Conference and Exposition, 2006. APEC '06. Twenty-First Annual IEEE, page 7 pp., 2006], [Leslie K. Norford and Steven B. Leeb. Non-intrusive electrical load monitoring in commercial buildings based on steady-state and transient load-detection algorithms. Energy and Buildings, 24(1):51-64, 1996]. Efforts have also been made towards eliminating the need to collect current readings by inferring these from pure voltage measurements [R. Cox, S. B. Leeb, S. R. Shaw, and L. K. Norford. Transient event detection for nonintrusive load monitoring and demand side management using voltage distortion. In Applied Power Electronics Conference and Exposition, 2006. APEC '06. Twenty-First Annual IEEE, page 7 pp., 2006]; while others have focused on methods that do not require an appliance to change from one state to the other but rather detect the presence of an appliance while it is being used [D. Srinivasan, W. S. Ng, and A. C. Liew. Neural-network-based signature recognition for harmonic source identification. Power Delivery, IEEE Transactions on, 21(1):398-405, 2006].

There are also a growing number of research projects that have explored different classification algorithms and feature extraction methods. Neural networks have been used by [A. Prudenzi. A neuron nets based procedure for identifying domestic appliances pattern-of-use from energy recordings at meter panel. In Power Engineering Society Winter Meeting, 2002. IEEE, volume 2, pages 941-946 vol. 2, 2002], and more recently by [Hsueh-Hsien Chang, Ching-Lung Lin, and Hong-Tzer Yang. Load recognition for different loads with the same real power and reactive power in a non-intrusive load-monitoring system. In 12th International Conference on Computer Supported Cooperative Work in Design 2008, pages 1122-1127. IEEE, April 2008]. Genetic algorithms and clustering approaches were applied by [M. Baranski and J. Voss. Genetic algorithm for pattern detection in NIALM systems. In Systems, Man and Cybernetics, 2004 IEEE International Conference on, volume 4, pages 3462-3468 vol. 4, The Hague, The Netherlands, 2004. IEEE] to data acquired from utility meters using an optical sensor. A rule based system was developed by [Linda Farinaccio and Radu Zmeureanu. Using a pattern recognition approach to disaggregate the total electricity consumption in a house into the major end-uses. Energy and Buildings, 30(3):245-259, August 1999] to solve the disaggregation problem. An attempt to create a general taxonomy for appliance signatures is presented in [H.Y. Lam, G. S. K. Fung, and W. K. Lee. A novel method to construct taxonomy electrical appliances based on load signatures of. Consumer Electronics, IEEE Transactions on, 53(2):653-660, 2007], where using clustering techniques and a novel feature set the researchers found common traits in the signatures of same-type appliances present in modern residential buildings.

Despite almost two decades of research in the area, techniques for non-intrusively disaggregating the total electrical load of buildings remain in the hands of researchers and have not yet been adopted by society in general. Even though the list of publications in the field is currently large, and still growing, the number of commercial applications of NILM is close to null. To date, the only commercially available line of products that makes use of the technique, in some extent, is developed by Enetics [Enetics, Inc. Enetics, Inc. (viewed Apr. 22, 2009). http://www.enetics.com]. These products are based on one of Hart's patents [George W. Hart, Jr. Edward C. Kern, and Fred C. Schweppe. U.S. Pat. No. 4,858,141—nonintrusive appliance monitor apparatus, August 1989.].

However, for a number of reasons the prior art has not yet reached wide adoption. One such reason is the fact that previous approaches have relied on custom hardware to monitor the power lines, which has only recently become inexpensive. Additionally, the level of unwanted noise present in modern building's electrical distribution system also makes the task more difficult. Attempts to detect events (e.g., appliance state transitions) in these settings prove to be much harder. Furthermore, the field of Machine Learning has progressed significantly in the past few years yielding more powerful algorithms that are yet to be explored in this context. As with signal processing techniques, all these algorithms can now be run on less expensive and more powerful computing platforms than those available in the past.

Training the algorithms has also been an obstacle for wide adoption. In order for the algorithms to learn how to correctly classify signatures of appliance state transitions, a number of examples need to be presented to them. This training process needs to be designed around the user, with the goal of providing an easy and simple experience. Manual training, by which the users switch appliances on and off and then provide a label for the state transition, should be used as a last resource and only when other approaches fail. The present invention includes methods for improving training, as will be described in more detail later in this document.

It is also worth noting that, with a few exceptions, such as [Linda Farinaccio and Radu Zmeureanu. Using a pattern recognition approach to disaggregate the total electricity consumption in a house into the major end-uses. Energy and Buildings, 30(3):245-259, August 1999] who utilized the time of day in their rule-based system, the vast majority of the previous work has focused on acquiring information from the power lines.

Another reason that this technology has not progressed from research to development may be the relatively low cost of electricity and consequent lack of interest in detailed measurement of its consumption. However, the growing body of research on the conservation effects of energy-use feedback is now starting to include evidence that real-time, continuous appliance-level information may be the most effective way to motivate behavior change [Corinna Fischer. Feedback on household electricity consumption: a tool for saving energy? Energy Efficiency, 1(1):79-104, February 2008].

Additionally, there are almost no studies on the human-computer interaction issues that such disaggregated datasets for the power consumption of buildings, as the ones that an implementation of NILM techniques would generate, would bring. How much information should be presented to the users of a facility? What is the appropriate way to display it? Which pieces of information are more effective for modifying behavior and reducing energy consumption?

Research projects where a number of different real-world buildings are being monitored using NILM are scarce, resulting in almost no scientific evaluation of the effectiveness of the technique for reducing energy consumption. Most of the literature draws its findings from controlled laboratory experiments, or one-time implementations on specific buildings. In 1997 the Electric Power Research Institute (EPRI) in California published a technical report [Electric Power Research Institute. Low-Cost NIALMS technology: Market issues & product assessment. Technical Report TR-108918-V1, Electric Power Research Institute, Palo Alto, Calif., September 1997] on the market feasibility of the NILM technology of the time, from the electric utility's perspective. In the report they conclude:

> Project results indicate that NIALMS is a cost-effective load research tool for two-state appliances. However, for NIALMS to penetrate the mass market, reduction of per unit costs and enhancement of the algorithm to handle multi-state appliances is necessary. To achieve this, NIALMS functionality must be embedded in a low-cost electronic meter. For a robust offering to residential customers, a reliable NIALMS function also may be bundled with other services.

The accompanying technical assessment report [Electric Power Research Institute. Low-Cost NIALMS technology: Technical assessment. Technical Report TR-108918-V2, Electric Power Research Institute, Palo Alto, Calif., November 1997] discusses some methods to resolve the issues. However, despite the fact that this was 12 years ago, there is still no important penetration into the market. More recently, in 2003, a report [Vernon A. Smith, Leslie Norford, and Steven Leeb. Final report compilation for equipment scheduling and cycling. Technical Report P-500-03-096-A2, California Energy Commission, October 2003] prepared for the California Energy Commission's Public Interest Energy Research (PIER) program, concluded that "there are issues regarding identification of multiple units of devices that are of the same make and model within a facility or on a branch circuit". It also stated that the commercial value of NILM would still need to be determined. One of the sections of this report corresponds to a Ph.D. thesis [Kwangduk Douglas Lee. Electric load information system based on non-intrusive power monitoring. Thesis, Massachusetts Institute of Technology, 2003. Thesis Ph. D.—Massachusetts Institute of Technology, Dept. of Mechanical Engineering, 2003] detailing all the improvements made to the technology up to that point, and supporting the technical recommendations for future improvements. Among the latter they mentioned: add the ability to monitor variable-power, constant-speed loads; and automate the training process "to the extent possible".

Accordingly, there is a need for improved methods and apparatuses for monitoring energy consumption and for related operations, and particularly for monitoring of energy consumption in buildings and providing consumption awareness to users and building management systems. Those and other advantages of the present invention will be described in more detail herein.

BRIEF SUMMARY OF THE INVENTION

The present invention is directed generally to methods and apparatuses for monitoring energy consumption and for related operations and, more specifically, for monitoring of energy consumption in buildings and providing consumption awareness to users and building management systems. The present invention has many uses and applications and may be used, for example, for non-intrusive load monitoring, electricity monitoring, energy monitoring, in-house energy management, building automation, and for other applications. As a result, the present invention may be commercialized by utilities or third-parties as a product that enables consumers to better manage their electricity consumption. It can also be commercialized as a software solution for data aggregators like Google who will eventually need to better understand the aggregate electricity data they are storing (e.g. via Google PowerMeter).

According to one embodiment, the present invention includes a system and method for monitoring the energy consumption of individual devices and appliances in a building using non-intrusive sensing technology and providing the resulting consumption information as feedback to users or automated energy management systems. Based on a technique called non-intrusive load monitoring, the use of individual appliances and devices in the building is disaggregated and determined from voltage and current measurements obtained via a single measurement device installed at the main circuit panel of the building. This information, possibly along with additional sensor information from other sensors installed throughout a building such as motion or temperature sensors, is used to accurately detect which devices are turned on and off throughout the building and when other events occur to change the power consumption. Unlike previous non-intrusive load monitoring inventions, the system employs user-interactive and semi-automated, on-line, training to learn how to detect events associated with the particular devices present in the building. For instance, detection of new or unknown appliances will cause prompting of the user to identify the new device, enabling the system to learn necessary power characteristics of the device so that future use is detected. Device use information is then analyzed to assess real-time consumption behavior, patterns in consumption behavior, and predicted upcoming consumption behavior. Consumption behavior is either fed back to the user with possible energy saving strategies via a user interface or input to a system for automatically managing energy consumption in the building.

The present invention may be implemented as a single-point measurement system that non-intrusively detects which appliances and devices are turned on and off in a building and reports usage information to either the user or an automated energy management system. Moreover, the system utilizes advanced non-intrusive load monitoring techniques, possibly in conjunction with additional sensors throughout a building, to detect device use, model patterns and trends in this use, and report appropriate use information and forecasts to users or other systems. The present invention may be implemented in many ways and may offer many benefits, some examples of which are identified below.

1. The system measures the voltage and current at only the main electrical feed of the building and uses signal processing, machine learning, or estimation techniques to recognize certain characteristics of the these measurements as corresponding to specific building appliances or devices changing states (e.g., turning on or off, a washing machine changing from rinse to spin, or a dishwasher changing states in its cycle).

2. Additional sensor information from the building such as temperature, humidity, illumination, motion, acoustics, or $CO_2$ sensors may be used to enhance the accuracy of the appliance detection system (e.g., light in the bathroom combined with a load signature resembling a hair dryer will increase the confidence in identifying the hair dryer as turning on).

3. The system uses analysis techniques from areas such as machine learning, signal processing, or estimation and control to compare the total electrical load with pre-learned appliance signatures to determine which appliance has changed state.

4. The pre-learned load signatures may be obtained either by direct identification by the user, user prompting by the system (e.g., "I saw something I don't know turn on—what is it?"), a pre-learning or training period when the system is first installed, or via an internet or remote database of common load signatures.

5. The system maintains a storage database of the history of detected appliance/device state transitions.

6. Learning algorithms (from, for example, machine learning or data mining) analyze the historical data stored in the system to detect trends or patterns in the use of appliances or devices. These trends may indicate common sequences of appliance use (e.g., the microwave is always used after the coffee machine turns on) or times of the day, week, month, or year when certain appliances/devices are most likely used.

7. The system reports user information back to the user via a remote user interface that is connected to the main system (installed at the main power feed of the building). Examples of communication to the feedback device include power line communication, wireless, direct wired connection, cable, Ethernet, etc.

8. The feedback system reports real time appliance/device use information to the user. The user can also prompt the device to provide an abundance of additional information related to historical device use, detected patterns or trends, predicted upcoming device use, suggest periods of time for use when cost of energy will be cheaper, report changes in energy consumption per device or activity that may be related to equipment degradation or malfunction, etc.

9. The user may input information about current utility rates, or the system may obtain real-time, possibly time-varying, current rates from the utility via the internet, and past, current, and predicted future energy costs may be reported to the user. Information regarding expected monthly electricity bills may be reported.

10. The system may (possibly upon the user's request) provide hypothetical upcoming energy spending scenarios related to device use and subsequently provide suggestions as to the most energy efficient behavior to use. For example, the system may report how much money it will cost to use a certain device in the future or may provide suggestions about the savings associated with using an alternative device or associated with using the device at a different time of day (in a variable pricing scenario).

11. The system may have access to weather information, for example via the internet, and can provide feedback that takes weather information into account. For instance, a projected heating/cooling bill may be reported.

12. The system may analyze and provide additional information regarding perfoiinance of a particular appliance or device. For instance, if the characteristic power signature of the dishwasher is detected as becoming different over time, this may be reported to the user as an indication of deterioration with a suggestion of having a maintenance inspection.

13. The system may have access to a global database of the performance, use, electrical efficiency, or energy costs associated with appliances and devices of others in a community. This may be others in the same neighborhood or city, or others that use the same brand or type of appliance. Such comparisons may lead to additional suggestions regarding maintenance, replacement (if damaged or too energy inefficient), or use.

14. The user may also obtain all relevant information via additional means of feedback such as personal mobile phone devices, portable devices, appliance interfaces or a web interface.

The present invention can also include or be embodied as computer software or other computer-readable instructions which, when executed by a processor, causes the processor to perform certain actions according to the present invention. The computer-readable instructions may be stored in one or more memory devices which may be part of the computer or computer system or which may be separate from the computer or computer system.

In one embodiment, the present invention includes a computer or computer system comprising a processor, memory, an input device, and an output device. The memory includes computer-readable instructions which, when executed, cause the processor to perform the steps or operations described herein.

The present invention may also use other data sources to provide information about which appliance has changed its state and when. These additional sources of information (e.g., environmental sensors, web-enabled calendars, etc.) may be included in one embodiment of the present invention to extend the NILM approach and increase its effectiveness.

The present invention allows energy feedback technology that balances the trade-off between information and cost. It includes a framework for leveraging easy-to-obtain data streams directly or indirectly related to a building's energy usage, to infer appliance specific electricity consumption. More specifically, the present invention may utilize electricity sensors (e.g., voltage and current transducers or an embedded combination of both) placed at the main electrical feed of the house, along with sensor readings from other devices around the building, to isolate the consumption of individual appliances and derive their operational schedule. Specialized machine learning and signal processing techniques are used to fuse the different data streams and identify characteristics in the signals that are specific to the operation of individual electrical loads. Thus, low-cost data can be converted to high-value information, enabling targeted feedback to promote energy-conserving behavior.

According to another embodiment of the present invention, users of buildings could receive alerts via text messages, e-mail, interactive displays or other wired or unwired devices or communication media type when their monthly consumption is projected to reach a pre-set maximum, along with a list of recommendations on how to lower it. If appliances are not behaving according to how they have in the past, perhaps because they are malfunctioning, another type of alert could be sent. When a new appliance is installed in the building, the system would detect a set of new, unrecognized events and ask the user to label them appropriately. The system may automatically suggest to the user the type of device of the new appliance according to its electrical signature. Finally, a detailed monthly report can be sub-divided by appliance, appliance-type, or by associated activity, allowing the users to better understand how each piece is contributing to their overall consumption. Comparisons with similar households can provide the necessary context for understanding the efficiency of the appliances.

Different data sources which will facilitate the present invention are becoming more and more common in modern buildings: smart power meters, environmental sensors, computer network traffic, and room scheduling databases. Google, for example, has partnered with General Electric to deliver solutions that make use of data received from utility smart meters and energy management devices, and provide individuals with near real-time access to their electricity consumption [Google. Google PowerMeter (viewed Apr. 22, 2009). http://www.google.org/powermeter.]. In most cases these data can be accessed without an additional cost, as many provide data feeds through standard protocols. By correlating information from these sources with the power measurements for the whole building, better estimates can be obtained. For example, if a light intensity sensor in a given room shows an abrupt increase, and at the same time there is an increase in the power consumption of the building, this correlation would make it more probable that the change was in fact due to a light bulb turning on in that room.

The present invention may be used to facilitate awareness about energy consumption by making use of existing infrastructure and minimal additional hardware; to empower the users by providing them with actionable information that can directly affect their behavior and have better control on their expenditure. The foundation of this approach lies in the concept of Non-Intrusive Load Monitoring (NILM), as it is known in the literature.

The present invention can be utilized to disaggregate the building's total power consumption into the individual appliances that compose it.

The present invention may take many forms and includes apparatuses, such as systems, devices, and computer-readable instructions as described herein, as well as methods for implementing the present invention. Furthermore, the present invention may have many variations. For example, the present invention may include one or more of the following features: (1) Semi-automated training of the NILM system (e.g., involving user feedback and prompting to learn appliance signatures); (2) the use of additional sensors to enhance the NILM technology (e.g., temperature, motion, etc.); (3) the use of an appliance signature database or repository, which may be stored on a remote utility server or elsewhere, similar to CDDB; (4) learning of appliance-use patterns from the NILM recognition to make better behavioral suggestions to the user; and (5) incorporation of additional information from manufacturers, social networking, etc. to offer advice or feedback regarding needed behavioral changes or the need for equipment replacement or repair.

In order to achieve wide adoption, the solutions need to be simple, easy to install, inexpensive and be able to return the investment in a reasonable time. The problem of appliance disaggregation being sought by proponents of NILM needs to be re-framed from a systems integration perspective, and that the focus should not be limited to the hardware and software requirements for analyzing voltage and current waveforms. It is generally the case that the more detailed the information we want to obtain about a building's electricity consumption, the higher the price we have to pay to obtain it [Berges, Mario, Lucio Soibelman, H. Scott Matthews, and Ethan Goldman. 2010. Evaluating the electric consumption of residential buildings: current practices and future prospects. In Proceedings of the Construction Research Congress 2010. Alberta, Canada, May.]. The present invention may include mechanisms to counter that, by leveraging existing infrastructure along with minimal additional hardware; and empowering the owners of the facilities by providing them useful information that will help them achieve cost savings.

In one embodiment the present invention includes a system or method that impliments or includes the steps:

1. Event detection: changes in certain metrics obtained from the overall voltage and/or current measurements of the building are detected and flagged as events for later identification.

2. Feature extraction: certain properties of the samples surrounding the detected event are used to describe it (e.g., the size of the step change of the total power).

3. Event Classification: flagged events are processed using a statistical method, usually a supervised learning algorithm, which assigns a label to it (the algorithm is usually trained before the installation of the system).

Other variations and alternatives are also possible with the present invention, and these and other teachings, variations, and advantages of the present invention will become apparent from the following detailed description of the invention.

BRIEF DESCRIPTION OF THE SEVERAL VIEWS OF THE DRAWING

Embodiments of the present invention will now be described, by way of example only, with reference to the accompanying drawings for the purpose of illustrating the embodiments, and not for purposes of limiting the invention, wherein.

DETAILED DESCRIPTION OF THE INVENTION 1.1 Introduction.

The present invention will be described in terms of several embodiments. These embodiments are illustrative of the present invention and the present invention is not limited to these particular embodiments.

1.2 Overview.

Figure 1:
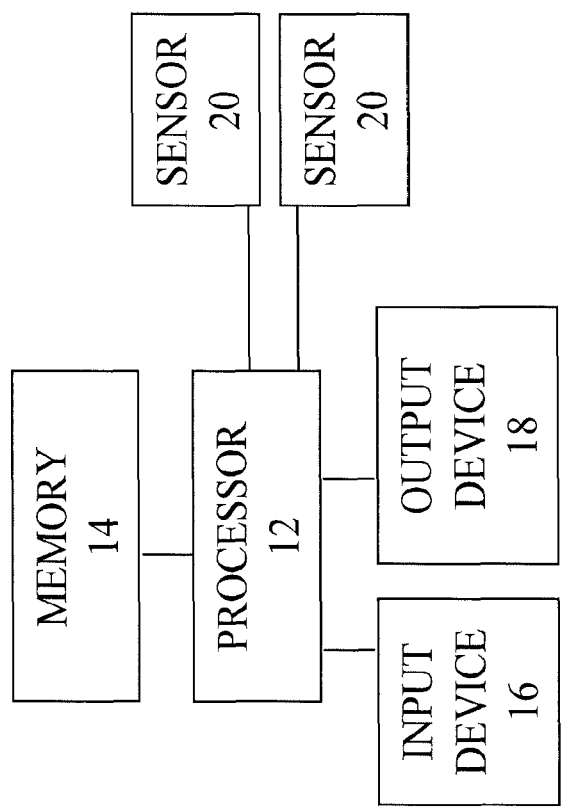
FIGS. 1, 2, 3A and 3B illustrate several embodiments of systems according to the present invention.

FIG. 1 illustrates one embodiment of a system 10 according to the present invention. In that embodiment, the system 10 includes a processor 12, memory 14, an input device 16, an output or display device 18, such as a monitor, and one or more sensors 20 which provide data to the processor 12. The processor 12 is connected to the memory 14, the input device 16, and the output device 18. The memory 14 includes computer readable instructions, such as computer hardware, software, firmware, or other forms of computer-readable instructions which, when executed by the processor 12, cause the processor 12 to perform certain functions, as described herein. For example, the computer-readable instructions may be used to perform the methods described herein.

The processor 12 receives input from the input device 16, and provides signals to control the output device 18. The processor 12 also performs certain functions, as described herein.

The memory 14 can be any form of computer-readable memory, and may store information in magnetic form, optical form, or other forms. The memory includes computer readable instructions which, when executed by the processor 12, cause the processor 12 to perform certain functions, as described herein. The memory 14 may be separate from the processor 12, or the memory 14 may be integrated with the processor 12. The memory 14 may also include more than one memory device, which may be integrated with the processor 12, separate from the processor 12, or both.

The input device 16 may be a keyboard, a touch-screen, a computer mouse, or other forms of inputting information from a user. The input device 16 may also be used for inputting information from a source other than a human user, such as a data port.

The output device 18 may be a video display or other forms of outputting information to a user. The output device 18 may also be used for outputting information to something other than a human user, such as a data port.

The sensors 20 may be connected to the processor 12 directly, as illustrated in the figure, or indirectly, such as through one or more intermediate devices. The sensors may sense power consumption or the sensors may sense characteristics other than power consumptions. For example, the sensors 20 may sense characteristics such as current, voltage, real power consumption, reactive power consumption, a harmonic of the real power consumption, and a harmonic component of the reactive power consumption. In other embodiments, the sensors may sense temperature, humidity, light, sound, gas levels such as oxygen, carbon dioxide, or other gas levels, radiation, heat, infrared light, pressure (e.g., air pressure, pressure on a surface such as a floor, or other measures of pressure), flow (e.g., air flow, fluid flow such as water flow through a sink, or other measures of flow), acoustic levels, electromagnetic fields, particulates in the air, motion sensors, the presence or absence of people in a room through one or more of the sensors mentioned above or through the use of other sensors, or other characteristics. This list of sensors is illustrative of the present invention, but the present invention is not limited to use with these types of sensors, and sensors that sense other characteristics may also be used.

The sensors 20 may be connected to the processor 12 or to one or more other devices via a wireless connection, a wired connection, or other means. As used herein, the term "wired" connection is broad and can include, for example, an electrical conductor (e.g., electrical wire), an optical conductor (e.g., optical fiber), or other wired connections.

The present invention may also store data in computer-readable form. The present invention will be described in connection with many different types of data, some or all of which may be stored in computer-readable form. This data may be stored in the same memory 14 in which the computer-readable instructions are stored, or the data may be stored in different computer-readable memory 14.

Many variations are possible with the system 10 according to the present invention. For example, more than one processor 12, memory 14, input device 16, and output device 18 may be present in the system 10. In addition, devices not shown in FIG. 1 may also be included in the system 10, and devices shown in FIG. 1 may be combined or integrated together into a single device, or omitted. Similar variations and modifications are also possible with the other embodiments described and illustrated herein.

The present invention may be embodied in many forms. For example, the present invention may be an embedded system such as software on a chip. In another embodiment, the present invention may be embodied as one or more devices located in one or more parts of the invention illustrated in FIG. 1. For example, the present invention may be embodied as computer-readable instructions (e.g, software on a chip, software in a portable or integrated memory device, hard-wired instructions embodied in a hardware device, or other variations). In another embodiment, the present invention may be embodied as one or more discrete computers. The present invention may also be embodied as computer-readable instructions (e.g., computer software, firmware, or hardware). The computer-readable instructions may be stored in memory devices which may be integrated or embedded into another device, or which may be removable and portable. Other variations and embodiments are also possible.

Figure 2:
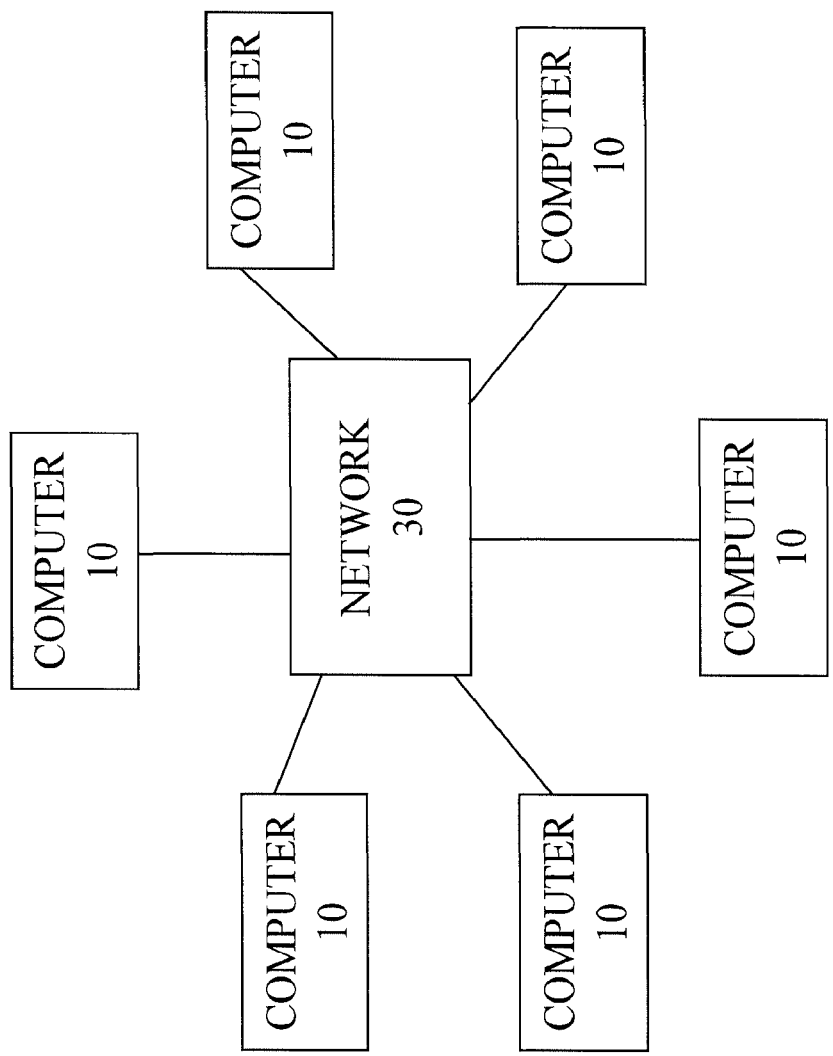

FIG. 2 illustrates another embodiment of the present invention in which several computers 10 are connected together via a network 30. The network, 30 provides a connection between several computers 10. The network 30 may be, for example, the Internet, a local area network, a wide area network, a metro area network, or other networks. The network 30 may be a wired network (such as an electrical network or an optical network), a wireless network, or a combination of different kinds of networks.

Figure 3A:
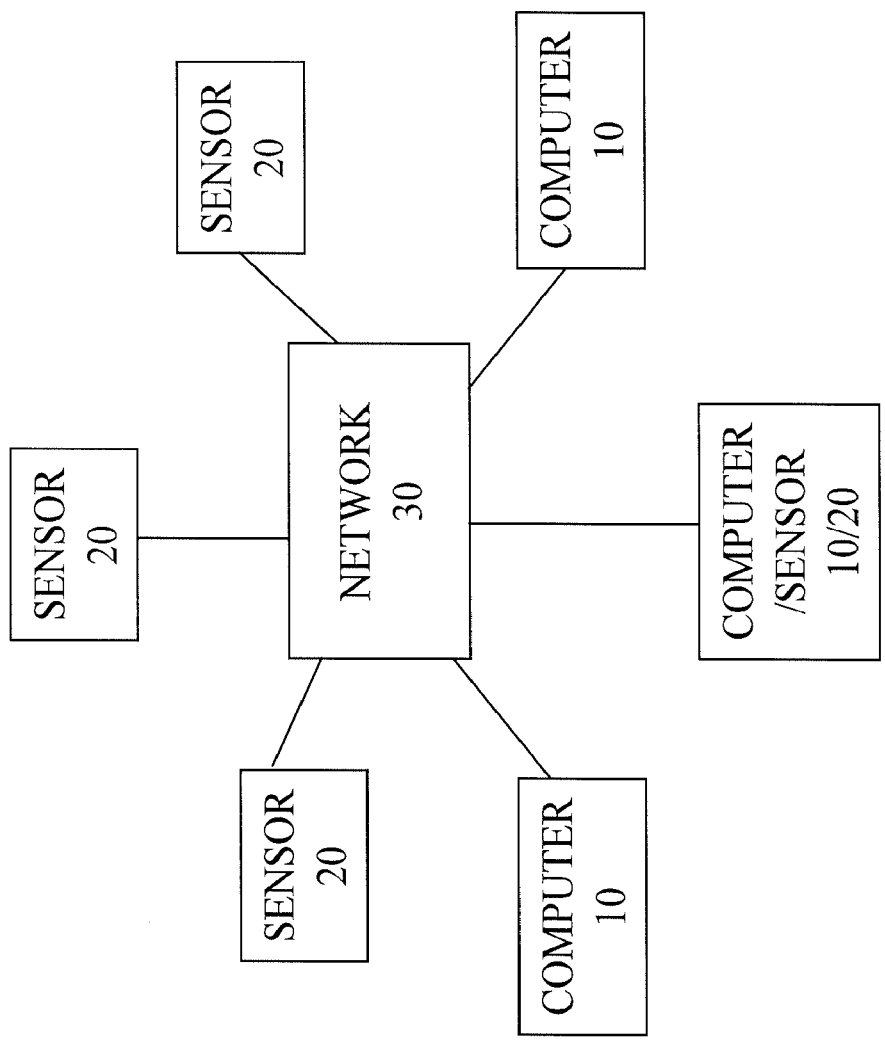

FIG. 3A illustrates another embodiment of the present invention in which sensors 20 are connected to the network so that the data gathered by the sensors 20 can be shared with one or more of the computers 10 to perform the operations described herein. For example, sensors 20 may gather data regarding energy consumption or other data as described herein, and that data may be sent to one or more computers 10, via the network 30, where the data may be processed or otherwise used in furtherance of the present invention as described herein.

The computers 10 and sensors 20 may be separate and distinct devices. Alternatively, the computers 20 and sensors 20 may be combined together, such as by integrating one or more sensors 20 with one or more computers 10, or by connecting one or more discreet sensors 20 to one or more discreet computers 10, or by other means. In an embodiment in which a computer 10 and sensor 20 are combined, the computer 10 may process data from the sensor 20 before the data is sent, via the network 30, to another computer 10.

As described above, the present invention may be embodied as software, hardware, firmware, or in other forms. The present invention may, for example, be embodied in some or in all of the computers 10 and/or the network 30. For example, one of the computers 10 may include software according to the present invention, and the other computers 10 may not embody the present invention. In other embodiments, several or all of the computers 10 may embody the present invention. In other embodiments, the network 30 may include one or more parts embodying the present invention.

Figure 3B:
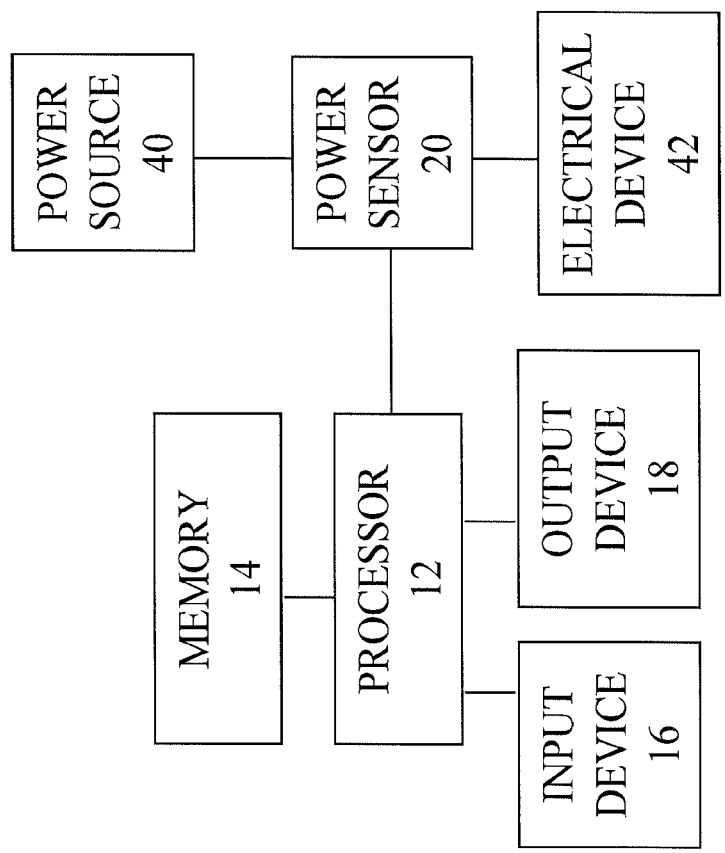

FIG. 3B illustrates another embodiment of the present invention in which the sensor 20 is a power sensor connected between a power source 40 and an electrical device 42. This embodiment is illustrative of the present invention, but the invention is not limited to this arrangement. For example, more than one electrical device 42 and more than one power source 40 may be used. Also, more than one sensor 20 may be used with one or more power sources 40 and one or more electrical devices 42.

Figure 4:
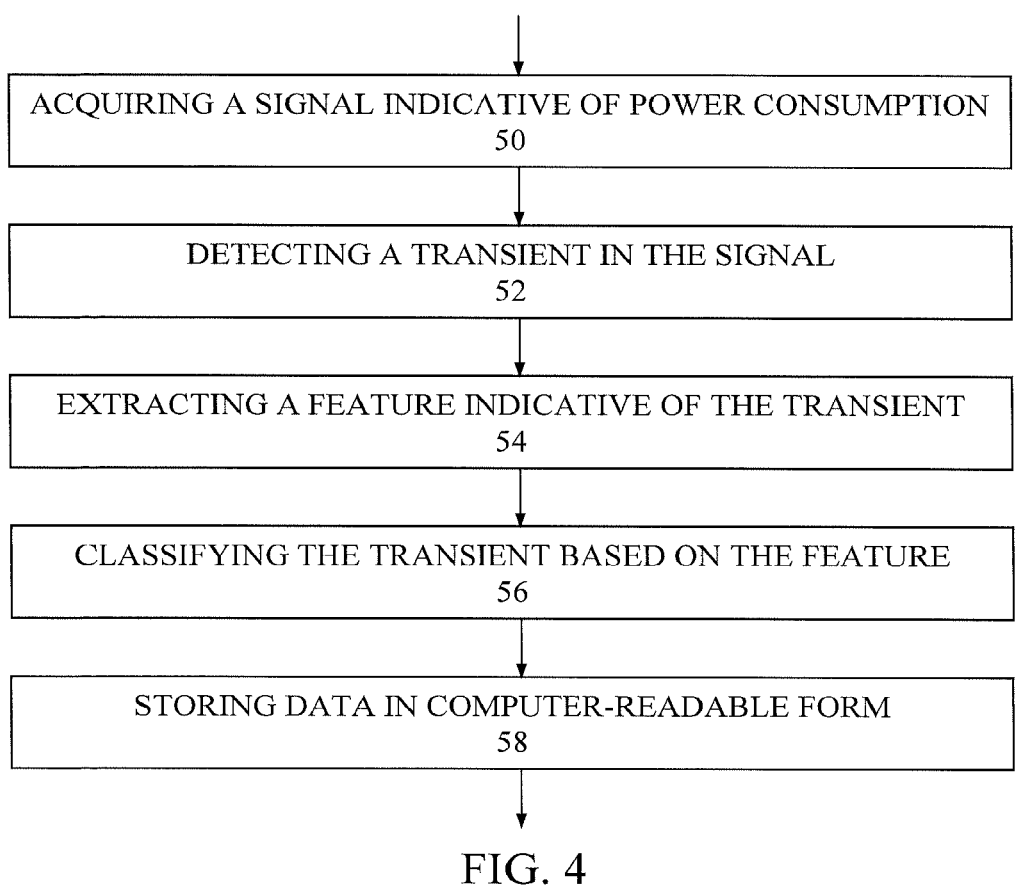
FIGS. 4-10 illustrate several embodiment of a method according to the present invention.

FIG. 4 illustrates one embodiment of a method according to the present invention.

Step 50 includes acquiring a signal indicative of power consumption. The present invention will generally be described in the context of acquiring many signals, although it is possible to use the present invention in applications in which only a single signal is acquired. Furthermore, the signal indicative of power consumption may take many forms. For example, the signal indicative of power consumption may be a signal indicative of real power consumption, reactive power consumption, a harmonic of the real power consumption, a harmonic component of the reactive power consumption, current, voltage, or other forms.

Step 52 includes detecting a transient in the signal. Detecting a transient can be performed in different ways, some of which will be described in more detail hereinbelow.

Step 54 includes extracting a feature indicative of the transient. Extracting a feature can be performed in different ways, some of which will be described in more detail hereinbelow.

Step 56 includes classifying the transient based on the feature. One way of classifying the transient includes comparing the feature indicative of the transient with known signatures of electrical devices. The known signatures of electrical devices may be stored, for example, as computer-readable data in the computer-readable memory 14. The computer-readable memory may be stored locally, such as in local memory 14 in the system 10, or it may be stored remotely, such as in memory 14 accessible via the Internet or via some other network or connection. Other variations are also possible. For example, the transients may be classified based on an analysis of the transient and/or an analysis of other data related to the transient. For example, an analysis of the transient may allow the system to infer details or characteristics of the corresponding electrical device, and these details or characteristics may allow the system to classify the transient. In another embodiment, one or more sensors (e.g., motion sensors) may determine that a person enters a room just before the electrical device turns on, and the person leaves the room as the electrical device is turned off, and the system 10 may classify the transients as corresponding to one of the electrical devices in the room. In another embodiment the sensors may detect where in the building the person is located at the time the electrical device turns on and off, the system may be able to identify the particular electrical device from this data. Other variations are also possible.

Step 58 includes storing data is computer-readable form. The data may be, for example, representative of the classification of the transient, or the feature indicative of the transient, or the detection of the transient, or the signal indicative of power consumption, or other data related to the present invention.

Step 58 is illustrated as occurring after step 56, although this step may be performed in other locations of the method and different types of data may be stored. For example, storing data may occur after step 50, and/or after step 52, and/or after step 54, in each case storing data related to that step. Although it is not shown in the other figures, the step of storing data may be performed after, before, or in connection with other steps of the method according to the present invention. In one embodiment, data is stored in computer-readable form after each step described herein. In other embodiments, data is stored in computer-readable form after fewer than every step. Many other variations are possible with the present invention.

Figure 5:
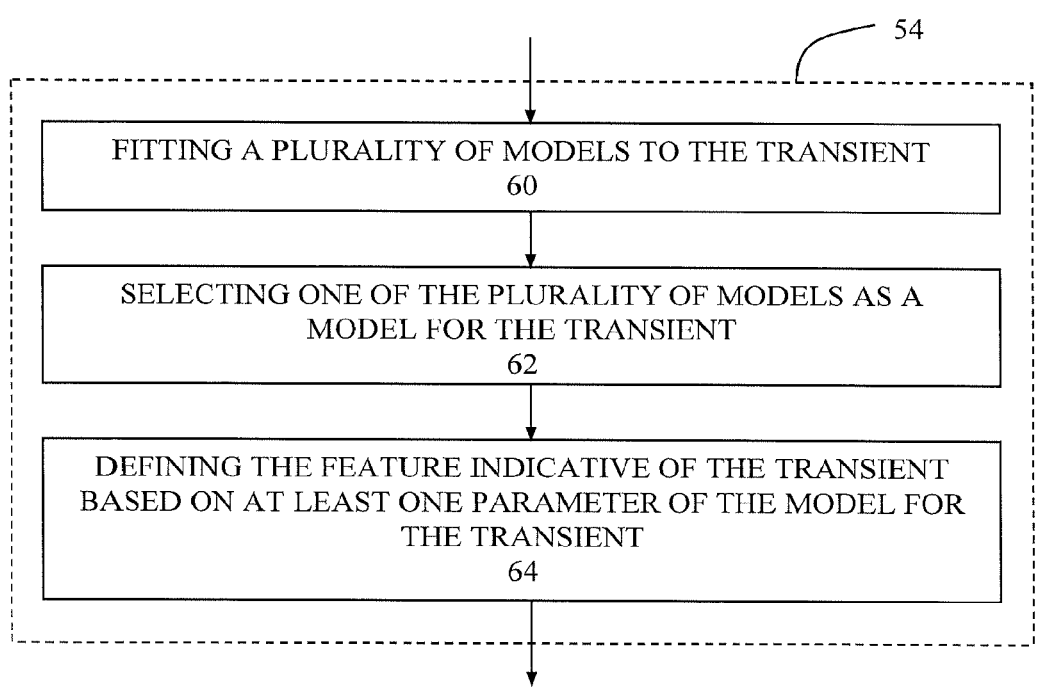

FIG. 5 illustrates one embodiment of step 54 according to the present invention.

Step 60 includes fitting a plurality of models to the transient.

Step 62 includes selecting one of the plurality of models as a model for the transient.

Step 64 includes defining the feature indicative of the transient based on at least one parameter of the model for the transient.

Figure 6:
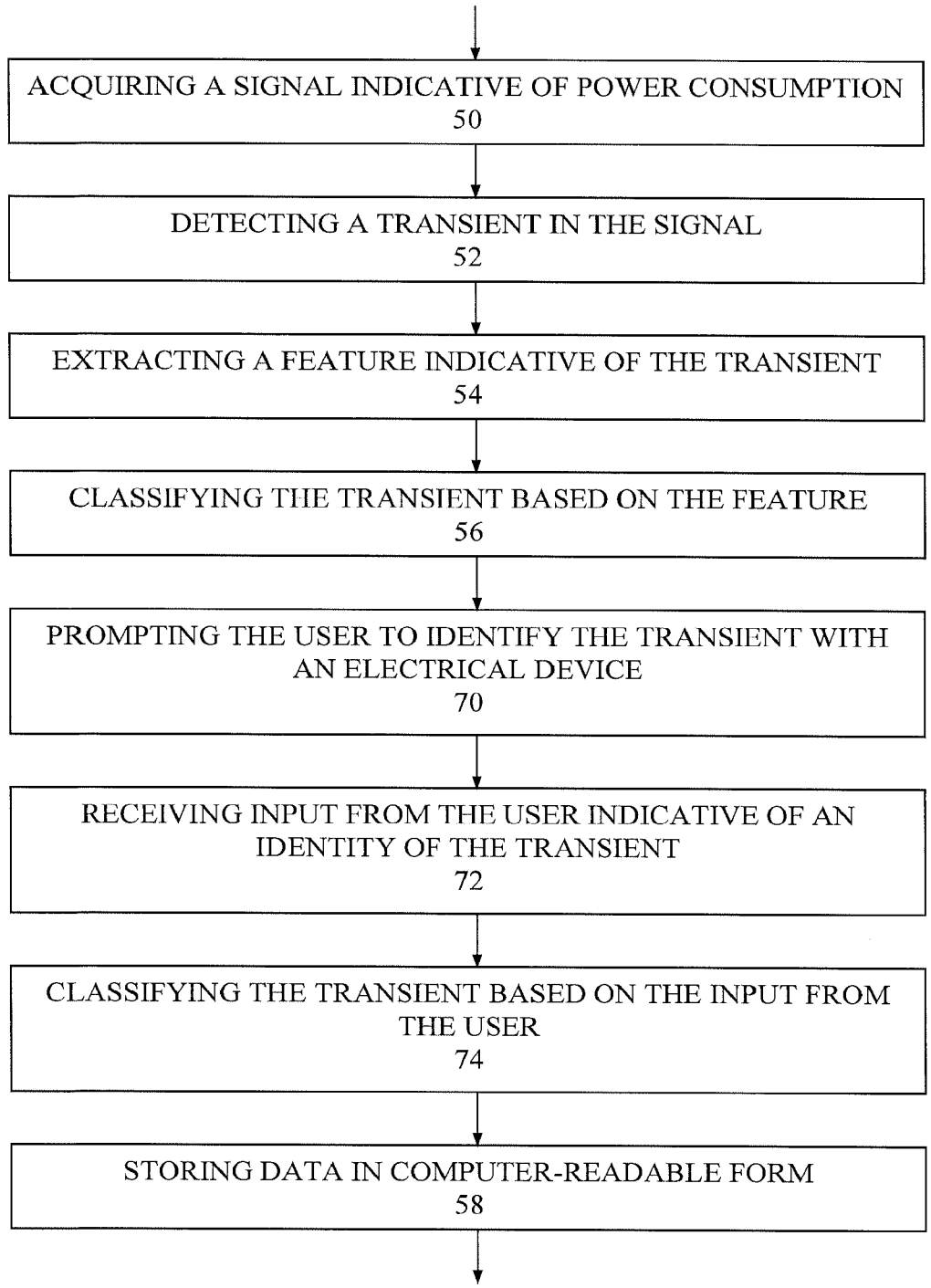

FIG. 6 illustrates another embodiment of the method according to the present invention. Steps 50-58 are the same as those described above.

Step 70 includes prompting the user to identify the transient with an electrical device. This may be, for example, providing a prompt or a signal such as an audible prompt or a visual prompt with the output device 18 and asking the user to identify transients with corresponding electrical devices. For example, in one embodiment the user may be prompted immediately after a transient is detected, such as by telling a user that an electrical device just turned on or off, and asking the user to identify the device. In other embodiments the user may be prompted well after the transient is detected, such as after a predetermined number of transients are detected, or at some other time. Prompting the user may also include providing the user with one or more suggestions for the electrical device corresponding with the detected transient.

Step 72 includes receiving input from the user indicative of an identity of the transient. This input is received via the input device 16 and may be, for example, audible input used in connection with voice-recognition, input entered by a user via a keypad, touch screen, or other form of the input device 16.

Step 74 includes classifying the transient based on the input from the user. In some embodiments the input from the user is the definitive classification for the transient and other classifications, such as those established in steps 54 and 56, are disregarded. In other embodiments, the user's input may be used along with other information to classify the transient. For example, in some embodiments, a transient may have a classification based on the user input and a classification based on steps 54 and 56. In some embodiments the user's input may be disregarded for purposes of classification if it is determined that the user's input is incorrect.

Figure 7:
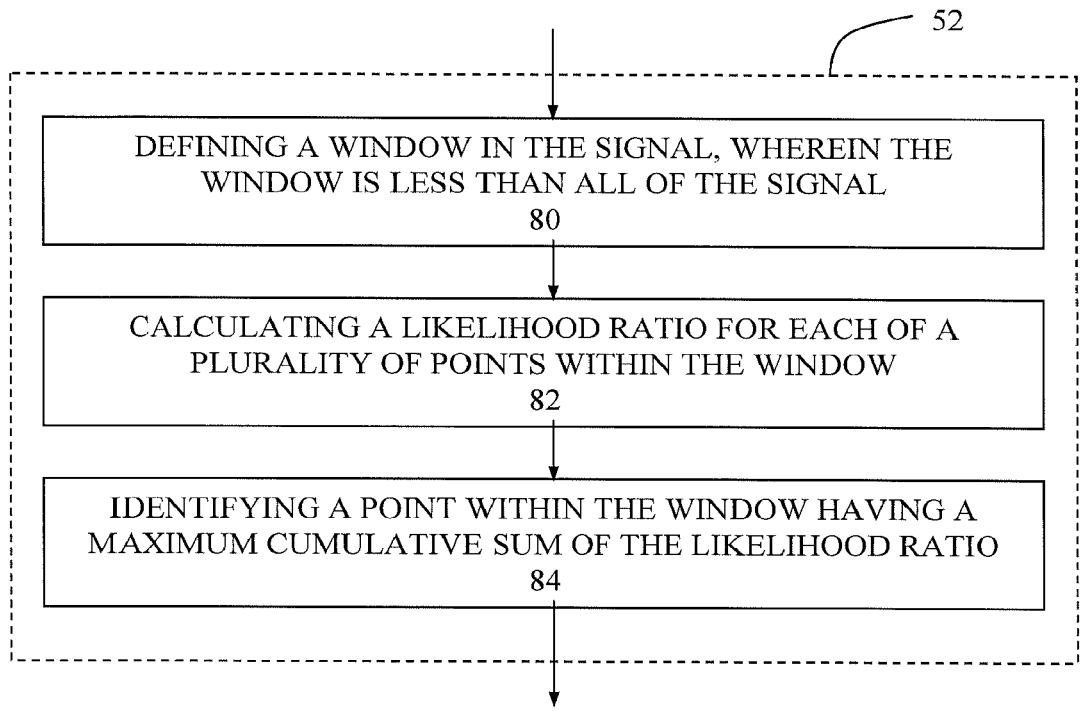

FIG. 7 illustrates another embodiment of detecting a transient, step 52, according to the present invention. In this embodiment, a subset of the signal (i.e., a window that is less than the entire signal) is considered for analysis.

Step 80 includes defining a window in the signal, wherein the window is less than all of the signals.

Step 82 includes calculating a likelihood ratio for each of a plurality of points within the window. For example, the likelihood ratio may be a ratio of the probability that the point is drawn from a Gaussian distribution with mean and variance computed from a window of a predetermined number of samples before and the probability that the point was drawn from a Gaussian with mean and variance computed from a window of a predetermined number of samples after. Other variations are also possible.

In another embodiment the likelihood ratio includes calculating:

$$vote_{index} = \underset{n \in w^e}{\operatorname{argmax}} \sum_{j=n}^{k} l_j$$

wherein:

$$l_j = \ln\left[\frac{P(P_1[j] \mid \mu_{after}, \sigma_{after})}{P(P_1[j] \mid \mu_{before}, \sigma_{before})}\right]$$

n is the number of samples in the detection window;

$\mu_{after}$ and $\sigma_{after}$ are the sample mean and variance over the range $[j+1, j+w_a^l+1]$, wherein $w_a^l$ is a predetermined number of samples after the current point in the test statistic window.

$\mu_{before}$ and $\sigma_{before}$ are the sample mean and variance over the range $[j-w_b^l-1, j-1]$, wherein $w_b^l$ is a predetermined number of samples before the current point in the test statistic window.

The length of the detection window, $w^e$, $w_b^l + w_a^l + 1$.

k is the last sample in the detection window $w^e$ $P(P_1[j] \mid \mu_{after}, \sigma_{after})$ is the probability that a sample is drawn from a Gaussian distribution with mean and variance computed from a window of a predetermined number ($w_a^l$) of samples after; and $P(P_1[j] \mid \mu_{before}, \sigma_{before})$ is the probability that the sample was drawn from a Gaussian with mean and variance computed from a window of a predetermined number ($w_b^l$) of samples before.

Other variations for calculating the likelihood ratio are also possible.

Step 84 includes identifying a point within the window having a maximum cumulative sum of the likelihood ratio, as defined by the $vote_{index}$ equation.

Figure 8:
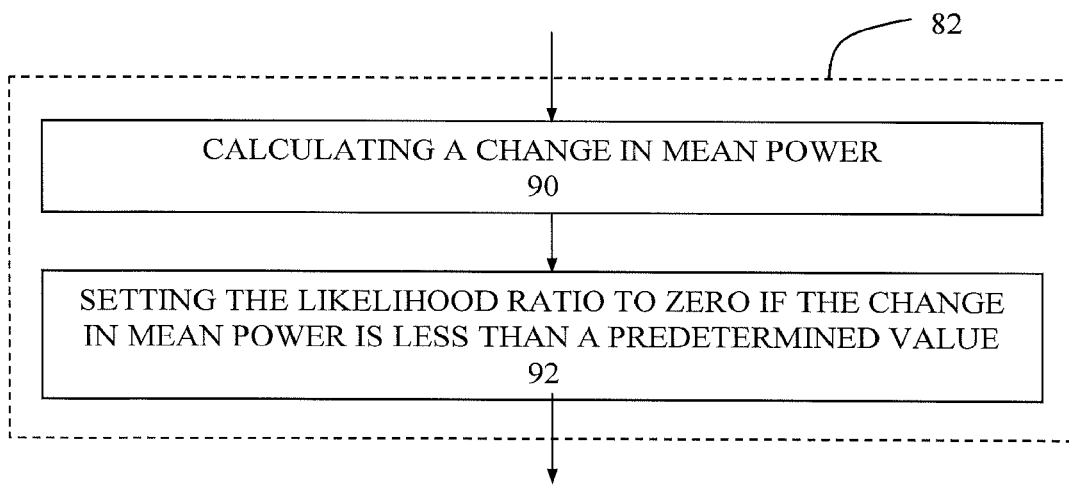

FIG. 8 illustrates another embodiment of calculating a likelihood ratio, step 82, according to the present invention. This embodiment may be used, for example, to reduce the likelihood of falsely identifying a transient by requiring a minimum change in mean power. It has been found that 10 Watts works well as the minimum value in some applications, although the particular value will vary depending on the particular application.

Step 90 includes calculating a change in mean power.

Step 92 includes setting the likelihood ratio to zero if the change in mean power is less than a predetermined value.

Figure 9:
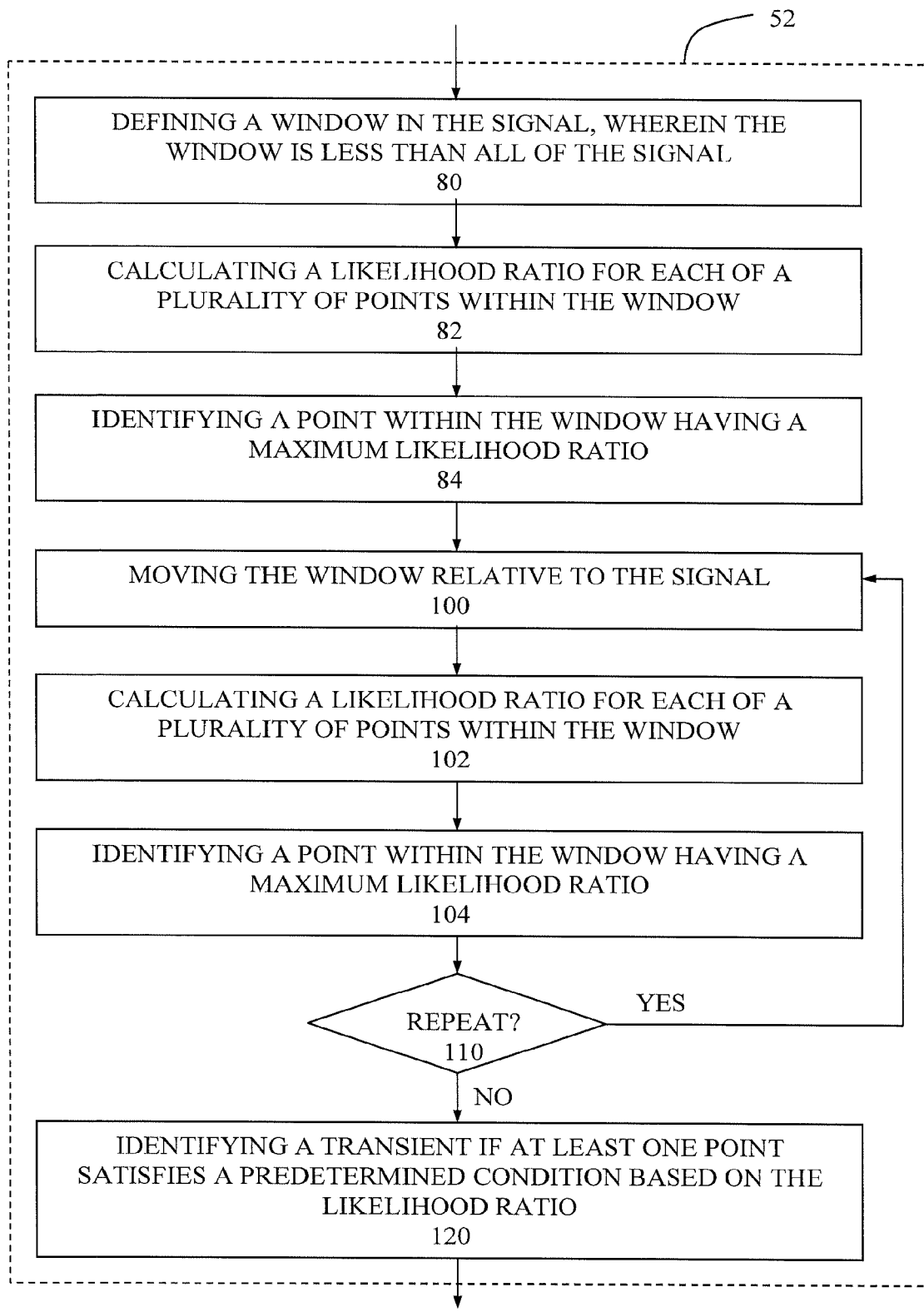

FIG. 9 illustrates another embodiment of detecting a transient, step 52, according to the present invention. Steps 80-84 are the same as those described above.

Step 100 includes moving the window relative to the signal. In other words, after identifying a point within the window having a maximum likelihood ratio, the window is moved to another part of the signal to repeat the process. In some embodiments the windows overlap each other and in other embodiments the windows do not overlap each other. In some embodiments the window is moved from one end of the signal to the other end of the signal, thereby sampling all or most of the signal at regular intervals. However, it is possible for the windows to jump around to different parts of the signals or to move randomly.

Step 102 includes calculating a likelihood ratio for each of a plurality of points within the window. This step is the same as step 82, except that it is performed after the window is moved and, in many cases, producing a different result because it is operating on a different part of the signal.

Step 104 includes identifying a point within the window having a maximum likelihood ratio. This step is the same as step 84, except that it is performed after the window is moved and, in many cases, producing a different result because it is operating on a different part of the signal.

Step 110 determines whether to repeat steps 100-104. The steps may repeat a predetermined number of time, or the steps may repeat until the windows have acted on the entire signal, or the steps may repeat until some other criteria is satisfied.

Step 120 includes identifying a transient if at least one point satisfies a predetermined condition based on the likelihood ratio. In one embodiment, a transient may be identified when at least one point is identified as having a maximum likelihood ratio in more than a predetermined number of windows. The predetermined number of windows will vary depending on the application and the desired results.

Figure 10:
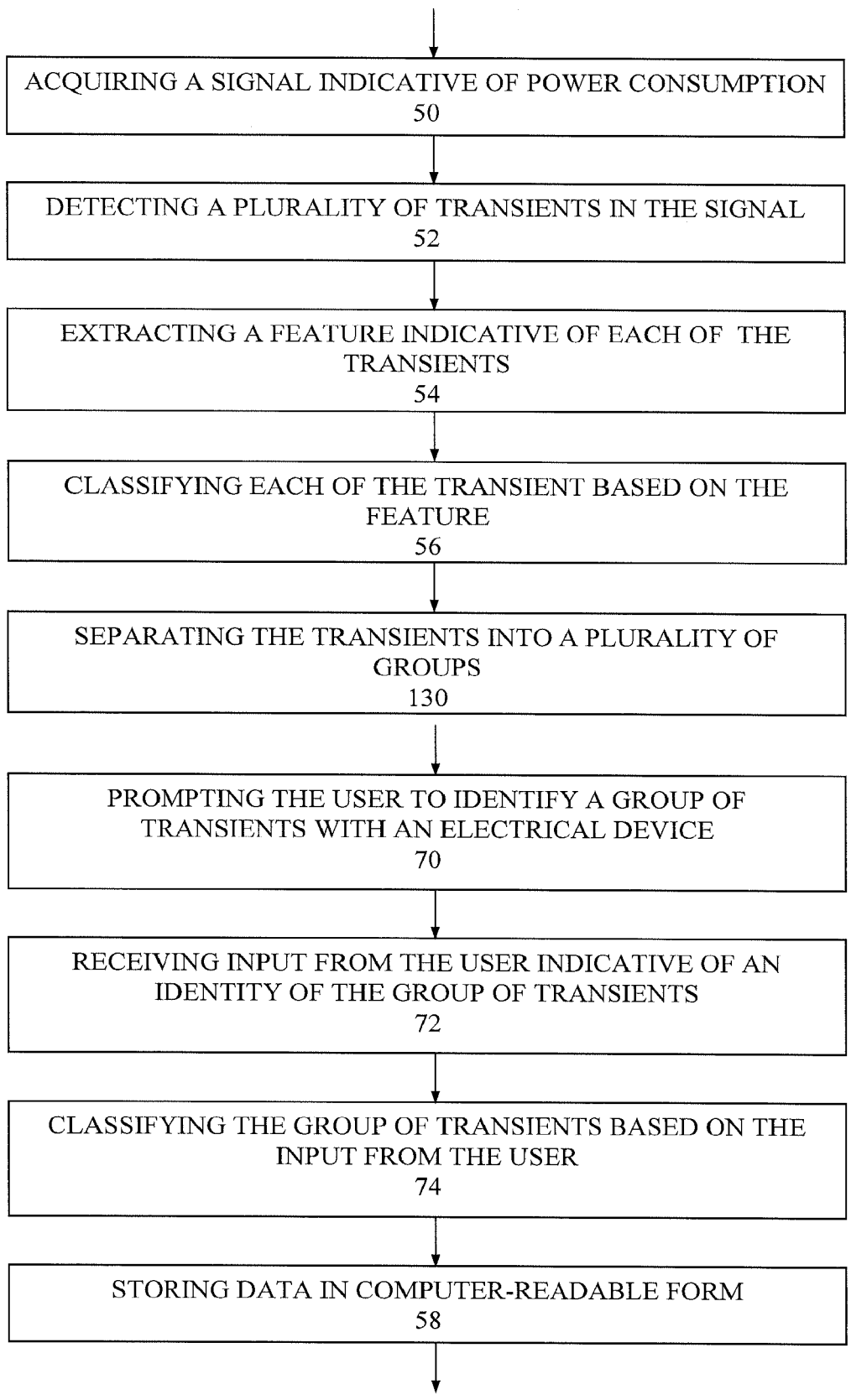

FIG. 10 illustrates another embodiment of a method according to the present invention in which a plurality of transients are detected and processed according to the present invention. An additional step, step 130, is also provided to group a plurality of the transients having a common feature.

Step 50 includes acquiring a signal indicative of power consumption.

Step 52 includes detecting a plurality of transients in the signal.

Step 54 includes extracting a feature indicative of each of the transients.

Step 56 includes classifying each of the transients based on its corresponding feature.

Step 130 includes separating the transients into a plurality of groups, wherein each group includes transients having one or more common feature. In general, each group is expected to be less than all of the transients detected. However, it is possible for all of the transients to be in the same group.

The transients may be separated into groups based on a number of criteria. For example, transients may be separated so that transients caused by the same electrical device or which appear to be similar or related devices are grouped together to make it easier for the user to identify the device corresponding to the transient. Alternatively, transients may be grouped together based on when they occur, or based on their frequency of occurrence, or based on their proximity in time to other transients, or based on other features.

Step 70 includes prompting the user to identify a group of transients having a common feature with an electrical device.

Step 72 includes receiving input from the user indicative of the identity of the group of transients.

Step 74 includes classifying the group of transients based on the input from the user.

The present invention will now be described in more detail and several embodiments will be illustrated and described. The specific embodiments and implementations described herein are illustrative of the present invention, and the present invention is not limited to those specific embodiments and implementations.

1.3 Exemplary System Embodiments.

Figure 11:
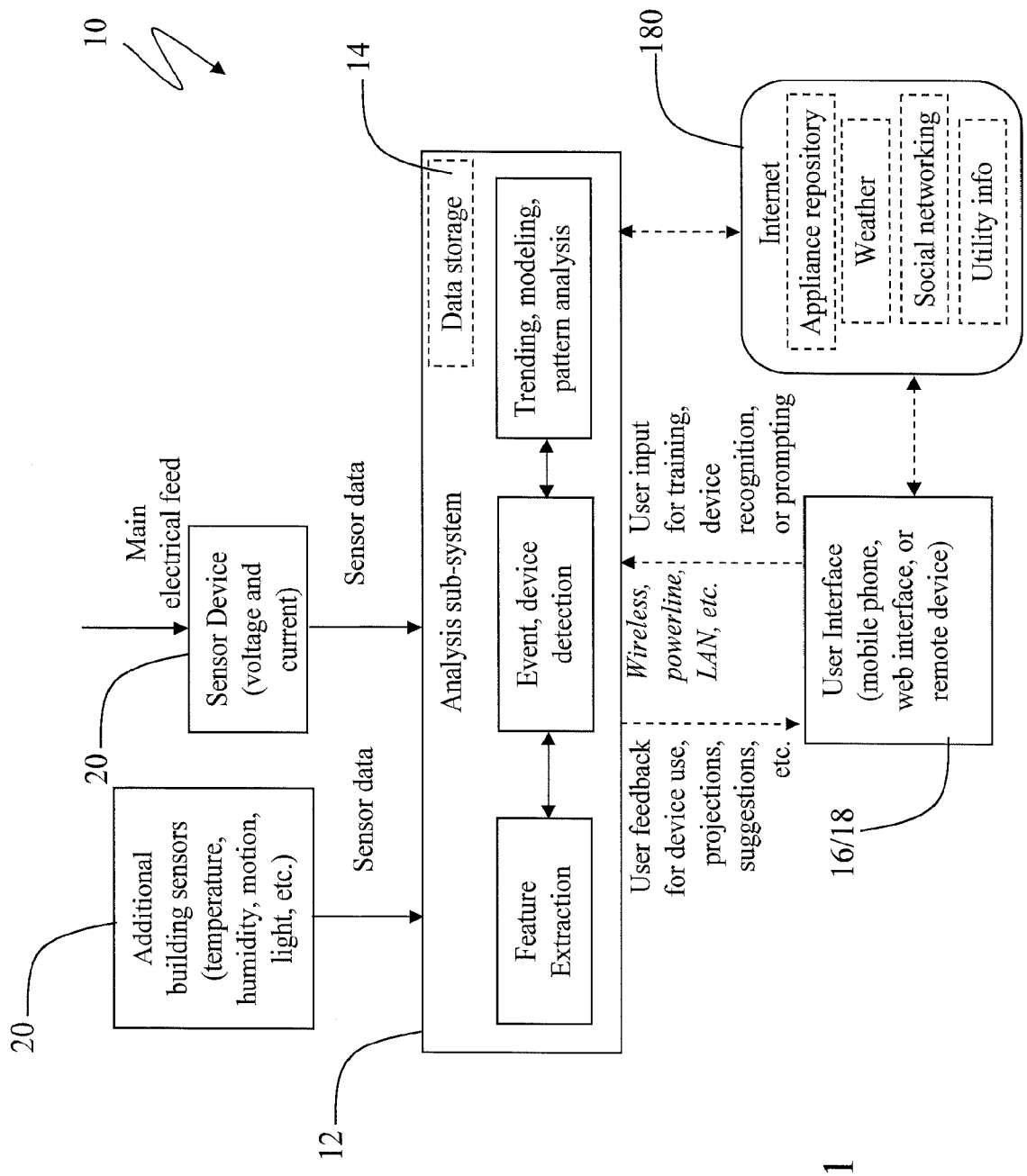
FIG. 11 illustrates a system according to one embodiment of the present invention.

FIG. 11 illustrates a system 10 according to one embodiment of the present invention. A Sensor Device 20 that measures voltage and current is connected to the main circuit panel or main electrical feed of the building. The voltage and current measurements can also be made at a subpanel level (individual circuits or plugs). Voltage and current readings are communicated and input to the Analyzer sub-system 12, which processes the measurements, extracts relevant features from the data, detects events in the data, and determines the appliance/device state transitions corresponding to the events. The Analyzer sub-system 20 may either reside physically next to the Sensor Device 20 (or be a part of the same processing unit) or at some other location. The Analyzer sub-system 20 analyzes and reports information regarding device use, performance, energy consumption, use trends, costs, etc. to the User Interface 16/18, which may be either: a user interface device in the building, a personal mobile phone device, an appliance interface or a web interface, or some other form of user interface. Communication between the Analyzer sub-system 12 and the User Interface 16/18 (or between the Analyzer sub-system 12 and the Sensor Device 20 if not part of the same unit) may take place via power line communication, wireless, or some other direct means such as Ethernet or coaxial cable.

The Sensor Device 20 is located in the main electrical feed of the house and contains sensors for measuring current and voltage. The physical connection of the sensors 20 may be via several means including, but not limited to, current clip-on transducers that "wrap" around the incoming electrical cables, directly embedded in the circuit breakers or direct connections. Sensor measurements may also be obtained from other sensors distributed throughout the building that are not physically residing in the Sensor Device. Supplemental sensors may include temperature, humidity, motion, illumination, acoustics, video, or carbon dioxide. All sensor data from the Sensor Device 20 and the additional sensors 20 are communicated to the Analysis sub-system 12, which may or may not share the same hardware with the Sensor Device 20. Communication of data to the Analysis sub-system 12 from the additional sensor data and from the Sensor Device 20 (when the Analysis sub-system 12 is separate from the Sensor Device 20) may take place via a communication means such as but not limited to power line, wireless, or local area network.

The Analysis sub-system 12 takes as input data from the Sensor Device 20 and the possible additional sensors 20 distributed throughout the building. Relevant features are extracted from the data. These may include, but are not limited to, features related to power consumption (e.g., real and reactive power or harmonic distortion) or harmonic contributions. The features are used to detect events in the sensor data such as when a device changes states. Signal processing, machine learning, or estimation techniques are used to compare the characteristics of the signal associated with the event to those stored either in the database of the Analysis sub-system 12 or a database 180 of appliance signatures contained remotely over the internet. The comparison results in either an estimate of which appliance changed state or a recognition of an unknown appliance in which case the user is prompted via the User Interface 16/18 to identify the unknown device or confirm a best estimate of the unknown device. Detected state transitions and the corresponding time stamps are recorded in the internal database of the Analysis sub-system 12. The database 14 of the Analysis sub-system 12 may also reside on a remote server not contained within the system 10 itself.

The Analysis sub-system 12 also analyzes the historical transition events stored in the database 14 using machine learning or pattern detection techniques to model or detect patterns in the behavioral use of the devices. Such models may contain information, for example, on sequences of device use (e.g., which device transitions occur typically before or after other device transitions) or times at which device transitions typically occur.

The system 10 may be connected to other resources via the user interface 16/18 or through a connection to other sources of information. For example, the Analysis sub-system 12 may be connected to the Internet 180 or to other networks or other data sources. In this way, the analysis sub-system 12 may obtain and share information. For example, the present invention may obtain information on appliances, such as appliance signatures, to assist in identifying transients with particular devices and to share information with other systems. The present invention may also obtain past and present weather information for correlating past and present energy usage with weather conditions, and the present invention may obtain future weather predictions for predicting future energy use based on predicted weather conditions. The present invention may access social networking sites to compare energy use with similar appliances' setups for example setups of friends or relatives, comparisons on energy use patterns may help to save energy. The present invention may access and share utility information, such as to provide information on past and predicted energy costs. The system 10 may also be connected to other sources of information for performing other functions.

Information computed or detected in the Analysis sub-system 12 is reported to users of the building (or other relevant parties such as utility companies, friends, or neighbors) via a User Interface 16/18. The User Interface 16/18 may take the form of a remote device within the building (e.g., a small handheld device with a LCD screen), a mobile phone device, an appliance interface or a web interface. The user interface 16/18 may provide information to the user regarding:

Real-time use of devices (e.g., which devices are currently on/off)

History of device use or patterns in device use

Forecasted upcoming use of devices (based on patterns learned)

Expected utility costs or energy consumption

Hypothetical utility costs or energy consumption of varying future scenarios

Weather and its affect on utility costs or energy consumption

Carbon footprint

User prompting for identification of unknown devices or transitions

Comparison of energy consumption, efficiency, or costs of devices to that of neighbors, friends, or others using the same devices, alternative devices, or the same utility company Current utility pricing Suggestions for least expensive behavior or actions Device performance (e.g., degradation, or time for maintenance)

2 Features and Objectives

Some additional features and objectives of the present invention will now be described. These features and objectives are not required to be implemented with the present invention, but they illustrate some of the advantages and variations possible with the present invention.

One goal of the present invention is to enable energy awareness in buildings. The awareness, in this case, does not refer to any conscious property of the building, but rather the term is used to summarize the concept of making electricity information (the form of energy that is the focus of this invention) available to the different components of a building: human users, automated building control systems, or any other party interested in it. This is how awareness is enabled. Particularly, this invention facilitates appliance-specific energy consumption data, as opposed to aggregate power draw, by leveraging low-cost data sources present in a building.

2.1 Main Invention Contributions

The present invention improves non-intrusive load monitoring techniques to be accurate and inexpensive enough to feasibly implement in current buildings. This includes overcoming several issues that have kept the technology from reaching widespread adoption. One aspect of the present invention is to achieve the appliance level energy awareness being sought by some proponents of NILM by: (a) distributing the training process by allowing appliance signatures to be shared; (b) leveraging the lower-resolution power data made available by current and future utility meters; and (c) leveraging easy-to-obtain data-streams about overall power consumption along with other indirect measurements of a building.

First, building occupants are integrated in the process of training the algorithms. The training process should be semi-automated and interactive allowing the system to continuously improve utilizing user input. Additionally, training should be distributed across buildings, allowing signatures that are obtained in one to be shared with the rest of the systems. In this way, there is a higher chance the system will recognize any new appliance installed in the building, provided someone else already went through the process of training.

Furthermore, one of the key enablers for the technology will be the data made freely available by the new generation of utility meters. NILM algorithms can be modified to achieve reasonable performance with the low-resolution data that is expected to become available from these meters. Section 2.3 discusses this topic.

Additionally, by incorporating additional sources of information other than the power distribution system in the building, the disaggregation process can be improved, and the training of the algorithms facilitated. Section 2.4 describes the improvements in this area.

Lastly, this invention creates a framework to incorporate all these ideas, a Multi-modal Distributed Non-Intrusive Load Monitoring approach (MODNILM) in buildings, that facilitates the sharing of appliance signatures across multiple systems and enables the integration of non-power related data sources to improve performance.

All of these contributions are described in detail below.

2.2 Distributing the Training Process

As previously shown in the literature review, research in the field of Non-Intrusive Load Monitoring has been going on for more than two decades. However, with the exception of a single company providing limited NILM solutions to electric utilities, the technology has not made its way to the market. The price of the hardware, the effectiveness of the algorithms and other similar reasons may have played a role in this outcome. More importantly however, the technology has failed to achieve market value due to the inability to find simple and scalable methods to train the system.

The reviewed literature revealed little detail on the training process. This could be due to a lack of work in the area, or because of unwillingness of researchers to share this information. To our best knowledge, there is no published research or patented inventions that propose to engage in meaningful, continuous interaction between the system and the building occupants. Virtually all implementations assume that the training phase would be done either before the installation of the system or during a short period of time following the installation. Aspects of the present invention include users of the building as an integral part of the system.

Under the NILM approach, appliances are recognized based on their electrical signature, or fingerprint. These are vectors obtained from characteristic features of the steady-state change in power metrics, the transient state between two steady-state power modes, the harmonic content of the current and voltage signals or a combination of these. The specificity of these signatures depends on the features used, the sampling rate, etc. For instance, it is possible to create very specific signatures that can be used to distinguish between the turning-on of a light bulb using one switch versus another switch in the house [Patel, Robertson, Kientz, Reynolds, and Abowd. At the flick of a switch: Detecting and classifying unique electrical events on the residential power line (nominated for the best paper award). http://dx.doi.org/10.1007/978-3-540-74853-3_16, 2007.]. Signatures can also be more general and only allow for the distinction of 20 W loads regardless of their origin or type (e.g., a 20 W light bulb or a 20 W fan are indistinguishable). The ability to compose these signatures is directly related to the hardware and software configuration used in the implementation.

There is an evident trade-off present here. The more appliance state transitions we want to be able to distinguish, and the more precise we want to be, the faster the signature space gets crowded and the higher the costs of the hardware needed to obtain such signatures, respectively. Furthermore, under the scope of energy conservation it is not clear, however, if obtaining such detailed signatures and being able to distinguish between, for example, the kitchen light bulb and the bathroom light is relevant. Even providing information about the energy consumption of certain low-power appliances (e.g., clocks, cell-phone chargers, etc.) is debatable in terms of its effect on reducing energy consumption.

Moreover, the signatures are in some ways tied to the hardware and algorithms used to obtain them. Utilizing signatures obtained with one system configuration on another system is not a trivial task. Portability of signatures would open a door for NILM to the marketplace by distributing and simplifying the process of training all systems for all appliances. However, to achieve this interoperability of signatures, it would be necessary to standardize the process of generating them, or a certain amount of meta-data would need to accompany such signatures so that they can be correctly interpreted and possibly transformed into a different representation.

A brief motivating scenario is presented, to illustrate the points discussed in this section. Imagine a NILM system installed in a building, that relies on 100 samples of the transient real-power profile as signatures (e.g., the change of power that occurs right after an appliance changes from one state to another), with power values collected at 20 Hz. Now imagine a separate system in another building which utilizes 1 Hz measurements of real power, and captures the same transient profile but using only 4 samples. Suppose that the first system has been trained on a particular type of refrigerator, and is able to identify its on and off events with high accuracy. The second building owner purchases the same refrigerator but has not yet trained his system.

Can the signatures obtained from one system be matched with those generated by the other to spare the user from having to train it? The answer to the general problem is probably no, but in the particular example presented here, and if the parameters used to create the signatures are known, it is possible to discover that both signatures are based on comparable features of the real power and thus, the only requirement would be to down-sample the 20 Hz signal accordingly.

In summary, the obstacles we find most interesting are all variations of the fact that NILM techniques require gathering a collection of signatures about appliances which are linked not only to the appliances, but also to the process used to obtain them.

Many variations and embodiments are possible with the present invention. One embodiment of the present invention includes populating a library of signatures after every single deployment of a NILM system. In another embodiment, the present invention includes an off-line training process where the library is populated before the deployment with some assumptions about the type of appliances present in the building that will be monitored. In another embodiment, the present invention includes a distributed approach where signatures can be shared among systems would speed up the process drastically and provide a simpler solution to the training problem. The present invention will generally be described in terms of the last approach, although other variations and modifications are also possible with the present invention.

2.3 Learning from Low-Resolution Electricity Data-Streams

One of the major concerns expressed by some of the reports discussed in the literature review, was around the costs of the hardware needed to implement NILM solutions. Although technological improvements in the past decade have diminished this concern drastically, there is now a possibly easier solution already in place in many buildings. We are referring to the new generation of utility meters, part of the Advanced Metering Infrastructure (AMI) [Edison Electric Institute. EEI—advanced metering Infrastructure/Smart grid (viewed Apr. 30, 2009). http://www.eei.org/ourissues/electricitydistribution/Pages/AdvancedMetering.aspx]. With devices like these already in place in the building, it is possible to obtain total power readings every few seconds using minimal hardware. The challenge, however, is that the reporting rate of these devices, and the type of information they communicate, is not necessarily what previous NILM researchers have been working with. The present invention may address these challenges as will be explained in Section 4.

2.4 Learning from Non-Electricity Data Sources

One other way the load disaggregation process can be improved is by supporting it with information from sources other than the main power distribution system of the building. Modern facilities are equipped with a variety of sensors, and IP-enabled devices. These data-streams can help overcome the hurdles that the past research has identified (e.g., tracking variable power, constant-speed loads), by providing independent information about the operation of the different appliances in the building, or narrowing the probability space for certain predictions. For example, some embodiments of the present invention may include additional sources of data to reduce the probability space of possible matches for a newly detected event. A motion sensor, for example, can indicate the presence of people in the kitchen, thus making it more likely that a toaster or stove is responsible for any event occurring when the kitchen is being used.

However, to make use of this information, the framework has to be extended and many issues need to be resolved. Perhaps the main two issues that need to be overcome are sampling rate considerations and meta-data. The first refers to the fact that the sampling rate for the different data sources may very well be different, thus making it more difficult to manipulate the signals under a single framework. Similarly, there will inevitably be time-synchronization issues, given that each source can have its own clock, and the different time delays introduced by the communication channels make it very difficult to correctly time-stamp the signals in the receiving end. For instance, a light intensity sensor publishing readings every minute may show, at 10:21:00 A.M., an abrupt increase in its values due to a light bulb turning on in its vicinity. By the time the message reaches the NILM-like system, it could be 10:21:02 A.M. However, using the electric power data, an event was detected at 10:20:46 A.M. The question is if both events can be attributed to the same phenomena?

This brings us to the second issue: meta-data. Information about the data-streams themselves, can help tackle this problem. For instance, if light intensity sensor information is available, this knowledge could be incorporated into the framework and enable a better assessment of the relationship between the different signals Other information, like the type of signal, the source, what it is measuring, etc. should also be available to the framework.

2.5 Framework for Multi-Modal Distributed Non-Intrusive Load Monitoring

Each of the ideas presented so far improves and extends traditional NILM, however, all the pieces need to be integrated together into a single unifying framework, and address all the issues that this integration will bring. This invention proposes an extended framework, MOD-NILM, which proves to be more effective (e.g., less costly to implement, more accurate, etc.).

One embodiment of the present invention is a system that is able to detect events occurring in the power line, and consult with a signature database to determine its nature. Users of the building can interact with the system through a graphical user interface, allowing them to provide labels for all events that are detected. In this manner, the system can be trained on new or poorly recognized appliance signatures. Similarly, a set of wireless sensor nodes that are monitoring the appliances at the plug level, can notify the system about an appliance-state change, allowing it to continue gathering training labels automatically.

A more in depth description of this embodiment of the present invention will be described in section 3.

2.6 Assumptions

The present invention will be described primarily in terms of residential buildings. However, the present invention can also be applied to other building-types.

For dealing with the additional sensor streams, we assume the input data arrives much like the raw voltage and current streams: in the form of a time-stamp and value pair. We also do not address issues related to establishing communication with the different sensor devices, in this document.

3 Distributing the Training Process and Sharing Appliance Signatures

Figure 12:
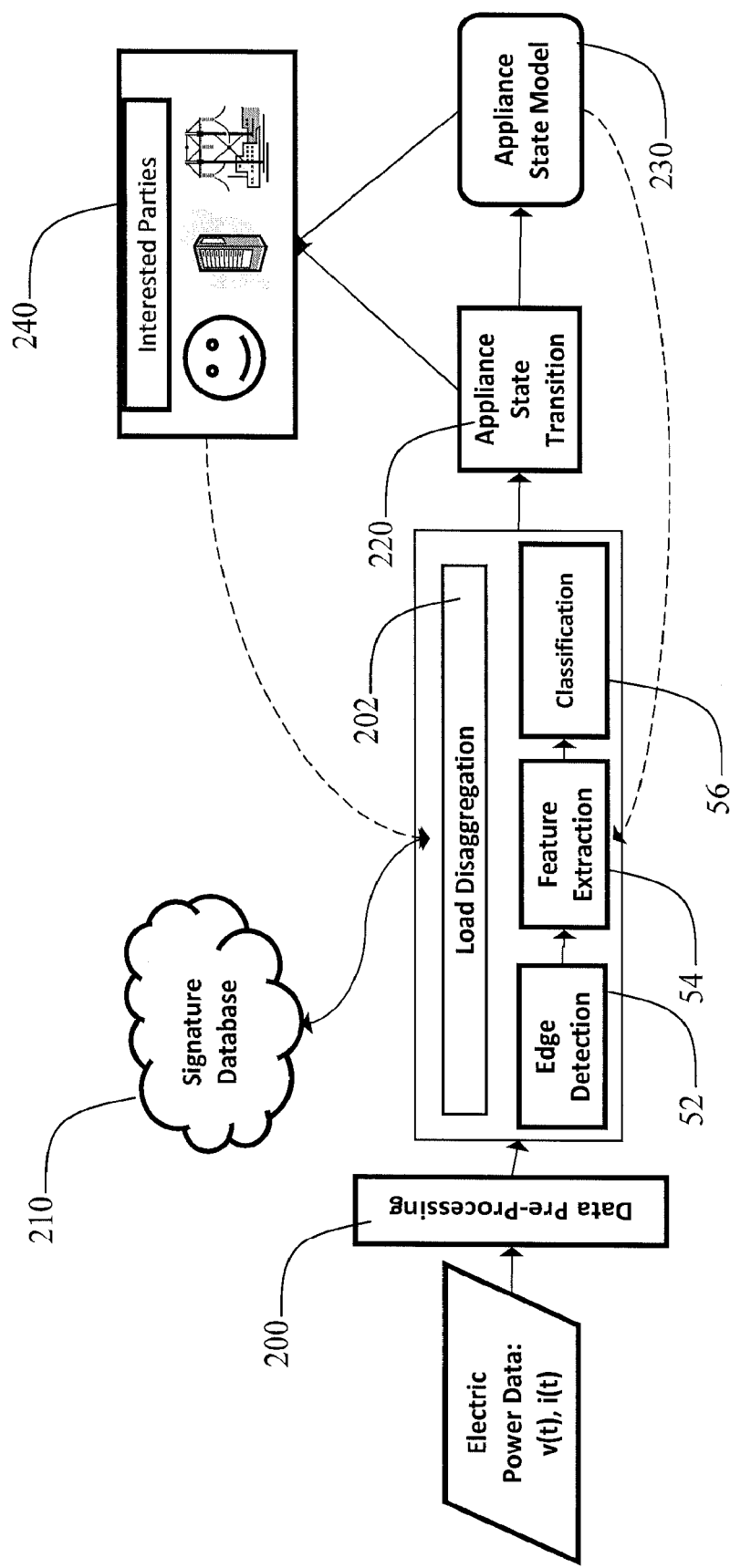
FIG. 12 is a block diagram illustrating different steps involved in the basic NILM implementation according to one embodiment of the present invention.

To be able to explain how the present invention can share appliance signatures and create a distributed way to train NILM systems, we must first detail the steps we take to arrive at such signatures. The block-diagram in FIG. 12 presents a high-level description of one approach to NILM according to the present invention. The diagram mainly shows the process with regards to the power data, leaving out most of the steps that deal with the other sources of information. A more comprehensive diagram will be presented in section 6, when we will describe the general framework according to another embodiment of the present invention.

The overall process presented in the figure, transforms easy-to-obtain data-streams in a building (the leftmost rhombus), into useful information about the energy consumption and operational schedule of the individual electrical appliances present in the facility. Following the arrows and starting from the data source, we see that the first step is to pre-process the raw data coming from the different sensors (voltage and current) in order to generate a useful and coherent datastream that captures the relevant information in the original signals in a structured manner. After this, the data is passed on to a load disaggregation process 202 which starts with the detection 52 of regions in the signals where there is a significant change of the mean value, which could possibly be an effect of the operation of an appliance. Following that, features are extracted 54 from a set of samples surrounding the detected edge in order to characterize it and be able to compare it later. Lastly, the load disaggregation process finishes with the application of pattern recognition 56 techniques to automatically classify the detected edges as described by the features that were recently extracted. Almost all previous research on NILM techniques focuses on this load disaggregation piece. A signature database 210 provides the patterns against which the classifier 56 will be matching. In the present invention, unrecognized signatures, either because of them being completely novel or due to poor training, can be labeled by an external agent (human user, machine, etc.) and be inserted into the signature database 210 for future reference. The signature database 210 may be embodied, for example, as part of the memory 14 described above, or it may be unrelated to memory 14.

Once the event has been classified 56, the output—an appliance state transition 220 (e.g., refrigerator went from off to on)—will be fed simultaneously to an appliance state model 230 and the interested parties 240. The appliance state model 230 will keep track of the operation of appliances and also inform the load disaggregator 202 for the prevention of misclassifications (e.g. a single appliance cannot go from off to on two consecutive times). Both the appliance state model 230 (historical) and the last recognized appliance state transition 220 (current) will be available to the interested parties 240: human users who occupy, manage or operate the building, building control systems, electric utilities, etc.

In the following sub-sections, we will describe in more detail each of the steps just described. In addition to the general explanations we will also, when possible, provide details about our experience based on our implementations with an early prototype version of a possible embodiment of the present invention, which can recognize approximately 18 appliances in a house, comprising close to 45 distinct appliance state transitions; with most of these being correctly classified 100% of the time. In this way the real world application of the framework will become clearer.

Given that we are building on top of previous knowledge, many of the steps (pre-processing and load-disaggregation) represent only variations on techniques already found in the literature. The main contributions in this section will be related to supporting and distributing the training process, and we will discuss our propositions in this regard in section 3.6.

3.1 Data Acquisition: Measuring Electric Power

The electric flow in a building's electricity distribution system is perhaps the most obvious source of information related to the energy consumption of electrical appliances in a building. By selecting where in the system to measure voltage and current, we can obtain different levels of aggregation of the power consumed by the appliances. For instance, to obtain the individual power consumption for each appliance without ambiguity, we would need to obtain measurements at the electrical outlet to which each appliance is connected, or somewhere between the circuit breaker and the appliance for larger loads like heating systems that are normally not connected to an outlet. Other circuits in the electrical panel feed a collection of different loads, making them the next logical aggregation point which we could measure. Similarly, the circuit panel itself is feeding on larger aggregation points that could be measured. As discussed above, by decreasing the number of sensing points we can achieve lower hardware and installation costs, but at the same time we increase the number of loads being monitored per point and can no longer directly measure the energy consumed by each load.

Residential buildings generally utilize a split-phase distribution system, where two AC voltage sources, 180 degrees apart form each other, are used to feed two separate set of circuits in the building. Some appliances utilize both phases together, while most feed from a single phase. Similarly, commercial buildings normally use a three phase distribution system, where voltage sources are 120 degrees apart. Again, here some appliances utilize all three phases (e.g. industrial motors, some air conditioning systems, etc.), while others utilize one or two. It is at this level of aggregation—the main voltage sources feeding an electrical panel in a building—where we believe NILM-like algorithms according to the present invention can provide the best balance between cost and the value of the resulting information.

3.2 Data Pre-Processing (200)

Once we have decided the measurement points, what follows is the selection of appropriate hardware to obtain such measurements along with the correct parameter settings for doing so (e.g., sampling rate). We will assume that such considerations will be carefully taken into account when implementing the framework (please refer to [H. Scott Matthews, Lucio Soibelman, Mario Berges, and Ethan Goldman. Automatically disaggregating the total electrical load in residential buildings: a profile of the required solution. In Intelligent Computing in Engineering (ICE08) Proceedings, pages 381-389, Plymouth, UK, July 2008.] for additional material describing electricity-related measurements). Most of the information that is extracted comes from the raw voltage, v(t), and current, i(t), waveforms. After sampling them, both these signals are discrete, periodic and theoretically sinusoidal. Their fundamental frequency is 60 Hz in the United States, and 50 Hz in Europe and other parts of the world. Both signals (particularly current) contain valuable information higher in the frequency spectrum. Specifically, the low-order odd-numbered harmonics (e.g., 180 Hz, 300 Hz, etc.) are of great value given that certain appliances increase the amplitude of those frequency components during operation. For these reasons, pre-processing performed on the original signals should try to preserve this information in at least some embodiments of the present invention.

The main idea here is to acknowledge that in the pre-processing stage 200, the high-speed voltage and current datasets can be transformed into lower-speed (down-sampled) representations that are more useful for interpreting the behavior of loads. We can use the voltage and current signals to obtain power metrics, which can provide insightful summaries for the behavior of the raw signals during a period. Power in AC circuits is a complex quantity, and can be defined by any two of the following scalar values: real (P(t)), reactive (Q(t)) and apparent power (S(t)). Real power is the ability of a circuit to perform work at a particular time. Reactive power can be defined as the power that is stored and then returned to the source during one period of the fundamental frequency of the voltage. Apparent power, in the other hand, is defined as the maximum power which may be transmitted and supplied for the load under sinusoidal, balanced, and symmetrical conditions; it represents the power that appears to the source because of the circuit impedance. Apparent power is the vector combination of the real-power and reactive-power.

For sinusoidal and periodic currents, these quantities are all well defined and easy to compute. However, a standard method for computing reactive power for nonlinear loads—which are more likely the case in modern buildings due to, in part, the number of rectifiers used by electronics—is still being debated [J. L. Wyatt and M. Ilic. Time-domain reactive power concepts for nonlinear, non-sinusoidal or nonperiodic networks. In Circuits and Systems, 1990., IEEE International Symposium on, pages 387-390 vol. 1, 1990.], [N. LaWhite and M. D. Ilic. Vector space decomposition of reactive power for periodic non-sinusoidal signals. Circuits and Systems I: Fundamental Theory and Applications, IEEE Transactions on, 44(4):338-346, 1997], [M. E. Balci and M. H. Hocaoglu. Comparison of power definitions for reactive power compensation in non-sinusoidal conditions. In Harmonics and Quality of Power, 2004. 11th International Conference on, pages 519-524, 2004]. Nonetheless, there are ways to compute reactive-power-like quantities as we will soon describe. One way to obtain power metrics while overcoming some of the issues with nonlinear loads, and at the same time preserve harmonic content, is to obtain estimates of the spectral envelope coefficients. This can be achieved by applying Short Time Fourier Transforms (STFT) on the current signal i(t) and later rotating those coefficients by θ, where θ is the angle of the first harmonic coefficient of the voltage signal. This process is proposed and explained in [S. R. Shaw, S. B. Leeb, L. K. Norford, and R. W. Cox. Nonintrusive load monitoring and diagnostics in power systems. Instrumentation and Measurement, IEEE Transactions on, 57(7):1445-1454, 2008]. In short, we would like to find estimates of the coefficients given in equations 1 and 2:

$$P_k(t) = \frac{2}{T}\int_{t-T}^{t} i(\tau)\cos(k\omega\tau)d\tau \qquad (1)$$

$$Q_k(t) = \frac{2}{T}\int_{t-T}^{t} i(\tau)\sin(k\omega\tau)d\tau \qquad (2)$$

where k is the harmonic index, and T can be one or more periods of the fundamental frequency of the voltage signal. P and Q are analogous to the conventional definitions of real power and reactive power, respectively, when k=1.

An array of coefficients $F[i]=(P_k[i], Q_k[i])$ for $k \in [1, m]$ as described above will be the data structure that we will mainly use during the rest of this document. Notice that the notation has changed to reflect the fact that these calculations are performed on a discrete, sampled signal. The size and update-frequency for this structure will depend on the parameters. For T being a single period, and $k \in \{1, 3, 5, 7\}$ it would result in an array of eight values at 60 Hz. Our testing prototype computes each of these values every three periods of the fundamental frequency of the voltage, resulting in a new F[i] 20 times every second (20 Hz) here in the United States. Additionally, it is worth mentioning that we are independently measuring voltage and current on each of the phases, resulting in a $F_a[i]$ for phase A, and a $F_b[i]$ for phase B of the electricity distribution system in the residential building being monitored.

It is worth noting that since this is a general framework, the above computations are not an absolute requirement, but rather one of the possible preprocessing methodologies. Utility smart meters, for example, will most probably not report these specific values; however, the framework can still be applied to such data streams.

3.3 Detecting Events (52)

The framework presented here relies primarily on the detection of appliance state transitions: moments in time when an appliance changes from one steady-state power draw to another during its operation (e.g., a light bulb turning on, a fan going from low to high). Clearly, although this might be the case for most residential appliances, not all appliances behave in such discrete fashion. Many appliances draw continuously variable levels of power (e.g., variable speed drives). However, we will deal with these cases in later sections, and will now focus on detecting state-transitions from the aggregate raw data streams.

Figure 13:
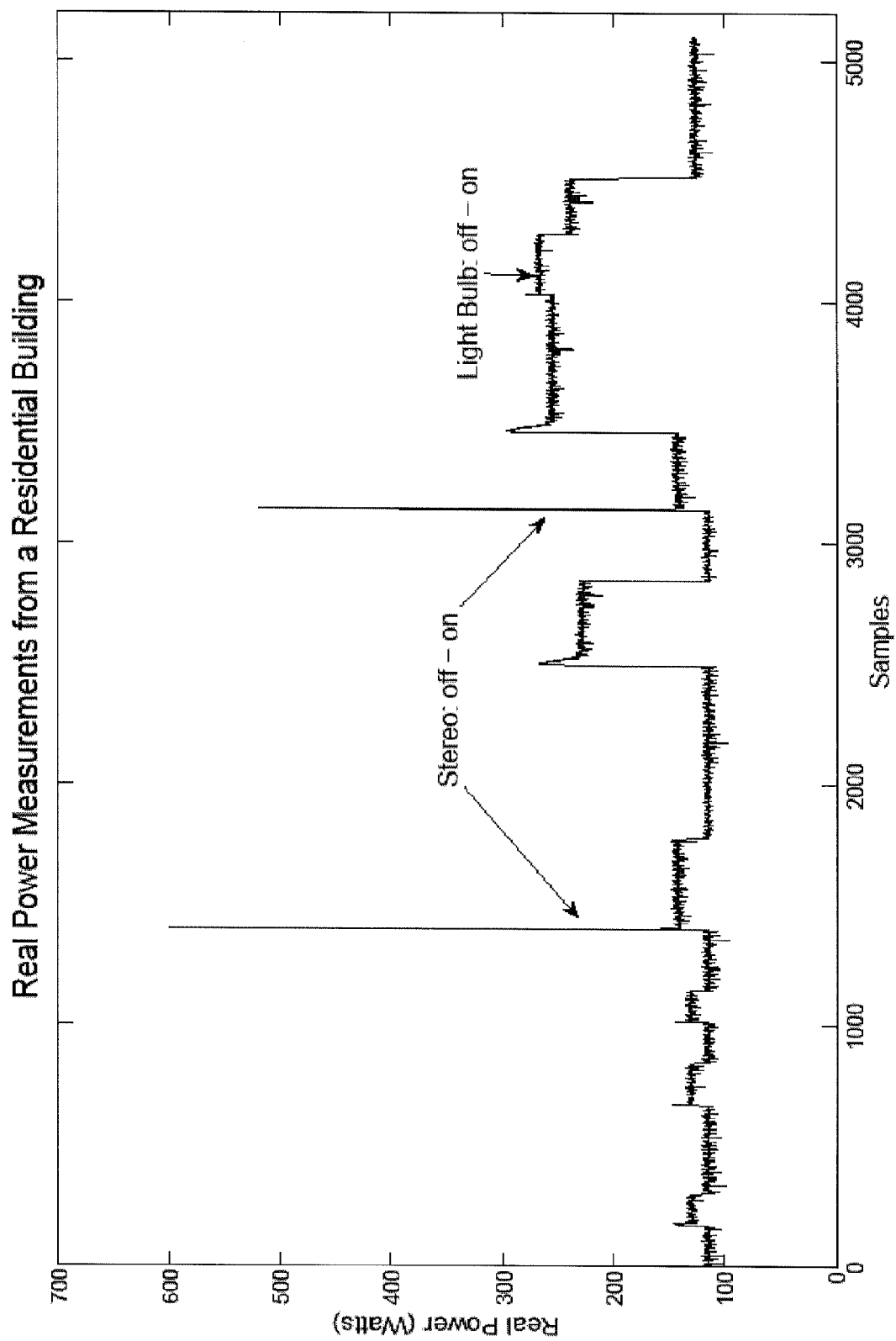
FIG. 13 illustrates the event transitions in total real power, in watts, for a residential building with devices turning on and off in over a period of three hours.

When an appliance changes its state, the algorithm should be able to detect this event from the aggregate readings for the building. FIG. 13 shows an example of a number of such events as seen in the total real power of a residential building we are currently monitoring. The most common approach for solving this problem is to use edge detection techniques for one-dimensional time-series, also referred to as time-series segmentation techniques. Some researchers have used a Generalized Likelihood Ratio (GLR) approach [Dong Luo, Leslie Norford, Steven Shaw, and Steven Leeb. Monitoring HVAC equipment electrical loads from a centralized location—methods and field test results. ASHRAE Transactions, 108 (1):841-857, 2002], [Mario Berges, Ethan Goldman, H. Scott Matthews, and Lucio Soibelman. Learning systems for electric consumption of buildings. In 2009 ASCE International Workshop on Computing in Civil Engineering, Austin, Tex., USA, June 2009.] with reasonable success. Another promising approach is to use wavelet analysis for this task as presented in [Charuleka Varadharajan. A wavelet-based system for event detection in online real-time sensor data. Thesis, Massachusetts Institute of Technology (M.I.T.), 2004. Thesis (S.M.)—Massachusetts Institute of Technology, Dept. of Civil and Environmental Engineering, 2004.].

Statistical methods are better suited for the event detection challenge given that the signal's variance and frequency contents change with time (e.g. a 5 W change in power could be the result of an appliance changing states, the normal operation of another appliance, or noise). This is the reason that, for instance, a change of the mean of the signal would be a good indicator for detecting steady-state appliance state transitions, such as the light bulb or stereo in 2, but a fixed thresholding approach would get confused with noise.

In our early experiments, we modified the GLR method presented in [Dong Luo, Leslie Norford, Steven Shaw, and Steven Leeb. Monitoring HVAC equipment electrical loads from a centralized location—methods and field test results. ASHRAE Transactions, 108(1):841-857, 2002]. The main differences in our version of the GLR algorithm are that: (a) to reduce the number of parameters that need to be set, instead of assuming fixed values for the standard deviation we continuously compute this metric from the samples; and (b) we implement a voting scheme on top of the output of the maximization of the detection statistic.

In our algorithm, we utilize two sliding windows for detection; both are of fixed length. The larger window is used for the voting procedure and we refer to it as the event detection window, $w^e$. The smaller window, which slides inside the larger, is used in calculating the likelihood ratio, $l_n$, for each point and is called the likelihood ratio window, $w^l$. The test statistic, $s_n$, used for determining which point receives a vote is the cumulative sum of likelihood ratios from the point in question to the last point of the event detection window.

With these quantities established, the algorithm works as follows. For each point in the event detection window both $l_n$ and in turn $s_n$ are calculated. If, in the larger event detection window the point's test statistic is the maximum among all points, it receives a vote. The event detection window then slides one sample, and the point with the highest test statistic in the new window receives a vote. This is how a single point can receive multiple votes, namely if it has the highest test statistic for multiple increments of the event detection window. Every point that receives a number of votes greater than a predetermined threshold ($v_{min}$) is labeled as an event and features from samples surrounding it are collected and fed to the classification algorithms (the topic of the next section). The likelihood ratio calculated at every point is $$l_n = \ln \frac{P(P_1[n] \mid \mu_{after}, \sigma_{after})}{P(P_1[n] \mid \mu_{before}, \sigma_{before})} \quad (1)$$

The test statistic, $s_n$, is then calculated using the likelihood ratios from the point in question to the last point in the event detection window, last ($w^e$)

$$s_n = \sum_{j=n}^{last(w^e)} l_j \quad (2)$$

Votes are assigned as follows $$vote_{index} = \underset{n \in w^e}{\arg\max} s_n \quad (3)$$

Where:
The probability distributions are assumed to be Gaussian.
$\mu_{after}, \sigma_{after}$ are the sample mean and variance over $[n+1, n+w_a^l+1]$.
$\mu_{before}, \sigma_{before}$ are the sample mean and variance over $[n-w_b^l-1, n-1]$.
$w_b^l, w_a^l$ are the number of points before and after the current point in the test statistic window. Thus the length of the test window is $w_b^l + w_a^l + 1$.

We analyze contiguous windows of n samples from $P_1[t]$ and apply formula 4 to each window. This computation will provide us with the index of the sample, in the window, containing the highest likelihood ratio. These ratios are between the probability that a sample is drawn from a Gaussian distribution with mean and variance computed from a window of $w_b^l$ samples before, and the probability that it was drawn from a Gaussian with mean and variance computed from a window of $w_a^l$ samples after. In essence, we are trying to identify the largest change in mean/variance.

To minimize the number of false positives we also introduced a minimum threshold for the change of mean $P_{min}$. During the calculations, each time $\mu_{after} - \mu_{before} < P_{min}$ we set the likelihood ratio to zero.

As the window slides through the real power time-series, each data-point can potentially be detected as an event by the above function. Each time this happens, we consider it as a vote in favor of it. Those points which receive more than V votes are finally considered to be events corresponding to appliance state transitions, and are passed on to the feature extraction phase. In our experiments we have found that a value of 20 for V is adequate for capturing most of the important events. Through similar trial and error processes we have arrived at the following settings: $w_a^l = w_b^l = 40$, $P_{min} = 10$-Watts. These parameters are shown for illustration purposes only, an adaptive method for determining and updating this parameter can also be implemented.

This strategy for segmenting the real-power time-series is far from optimal. Visual inspection of the results of an implementation of this algorithm in a residential building shows a considerable number of false positives. This is most evident when continuously variable loads, such as the heating system in the mentioned building, are turned on. The gradual change in power that characterizes loads like these, triggers constant detection of events by the algorithm.

Furthermore, even though all appliances will have an effect on $P_1[i]$ (which is why virtually all NILM event detectors focus on it), some embodiments of the present invention can apply the event detection techniques to other data streams. Particularly in the case of non-power data-streams, it is certainly important. But there are reasons to believe that a specialized event detector monitoring specific harmonic components (e.g., $P_3[i]$) could be more sensitive to the operation of specific appliances and less susceptible to noise in the fundamental frequency.

Figure 14:
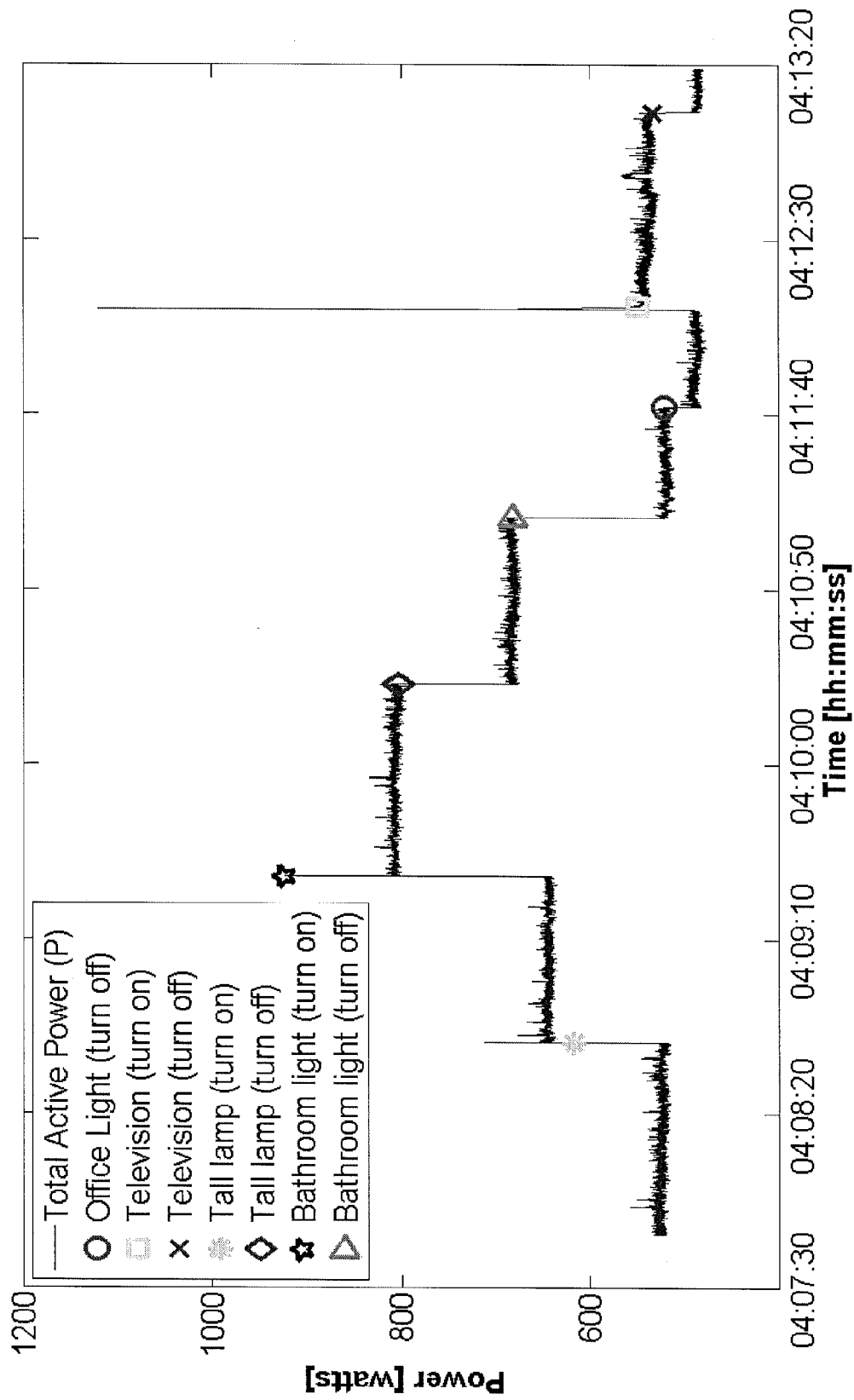
FIG. 14 illustrates appliance state-transitions as detected by the event detector according to one embodiment of the present invention.

FIG. 14 shows a number of appliance state transitions as detected by the event detector we described in this section.

3.4 Extracting Features (54)

After an event is detected 52, certain information about it needs to be obtained so that it can later be classified. At this point, we still only know that an appliance state transition may have taken place. Hence, we now focus on the fabrication of appliance signatures, or fingerprints.

Appliance signatures can be thought of as vectors in f-dimensional space where f is the number of features extracted from the input sensor data in the vicinity of the detected event. Examples of these are the change in real power, the change in reactive power, the shape of the transient profile in any of the $P_k$ or $Q_k$ coefficients, etc. Features can also be extracted from the other sensor streams, but this will be the topic of section 5.

In our initial implementations, and because of the experimental nature of these, we have worked primarily with fixed length transient profiles obtained from the samples surrounding the detected events. With these windows of raw data—for example 60 F[i] samples before and 60 after the event in question—and the index corresponding to the time when the change of mean occurred, it is possible to capture most of the relevant information about the state transition, provided the window is of an appropriate size. We will explore the effects of choosing a specific window size to extract these profiles later, in section 3.5. For the time being, however, we will assume a fixed window size $\gamma$, composed of $\beta$ samples before and $\alpha$ samples after the event, was selected.

Figure 15:
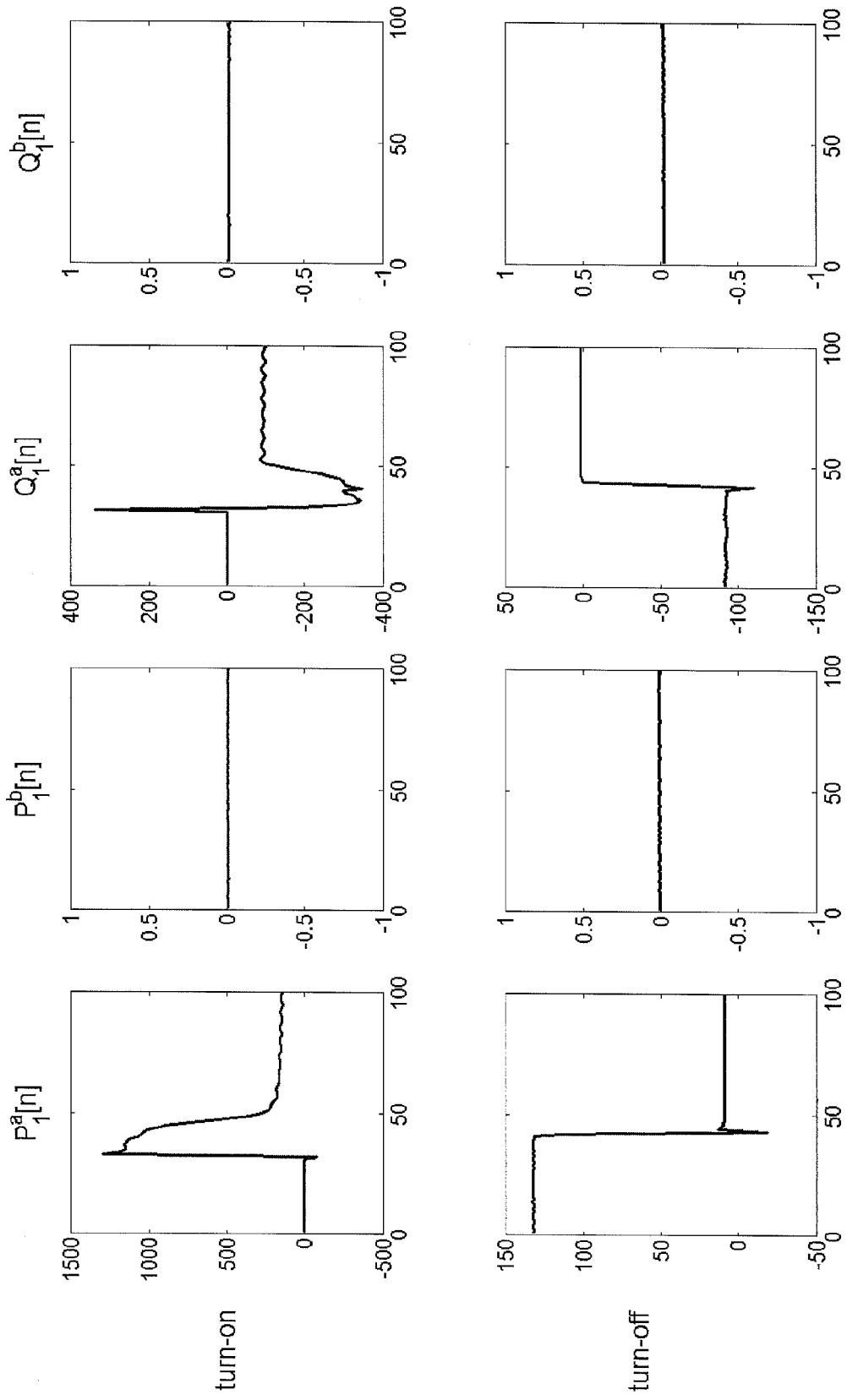
FIG. 15 illustrates transients for a refrigerator turning on and off. The rows represent the different appliance state transitions (off-on, on-off). Columns separate the four different transients ($Pa[i]$, $Pb[i]$, $Qa[i]$ and $Qb[i]$, in that order). Horizontal axis represents sample index i, and vertical axis represents value of the spectral envelope coefficient.

Additionally, during our initial experiments we only focused on $P_1[n]$ and $Q_1[n]$ for each phase in the power distribution system. This results in four dimensions for our transients, namely $F[n] = (P_{a,1}; P_{b,1}; Q_{a,1}, Q_{b,1})$. We will sometimes remove the subscript 1 when referring to the fundamental frequency component, if it is clear from context. FIG. 15 shows these transients for a refrigerator turning on and off. We extract features from each dimension independently.

Each detected event generates a set of transient profiles like the one just shown. The goal of the feature extraction process 54 is to obtain characteristics that can be used to describe these profiles and later compare them. As an example of what these characteristics might be, these are the five different sets of features we decided to extract during our experiments: (1) a delta metric, (2) the transient profile; and linear regression coefficients using different basis functions: (3) polynomial, (4) Gaussian radial basis functions, (5) Fourier basis. The first, and the simplest, the delta metric, is the result of subtracting the average value over the samples in a post-event window, from the average over a pre-event window. This would give us the size of the change in the signal, and would work best for appliances which quickly reach a steady-state power draw after going through a state transition.

The second feature set, the transient profile, is obtained by simply storing the complete set of sample points that describe the transient. Each sample was considered to be a separate feature, resulting in a γ-dimensional feature vector.

Thirdly, we decided to investigate the use of linear regression coefficients as features that could summarize, in a lower dimensional representation, the information contained in the transient, with the additional benefit of being less susceptible to noise. Three different types of basis functions were explored, and the coefficients were obtained by applying ridge regression—a least squared error method—as explained below.

We assume that the signal can be represented as a linear combination of basis functions:

$$\hat{y} = \phi(x)w \quad (1)$$

where x is a column vector of n elements. In our scenario these elements are the sample indices, which are the integers in [1, n]. w is a column vector of m elements, also called the weight vector. This vector contains the coefficients we are after. $\phi(x)$ is a matrix of n rows and m columns, where each column is defined as:

$$\phi(x) = [\phi_0(x), \phi_1(x), \phi_2(x), \ldots, \phi_m(x)] \quad (5)$$

Each $\phi_i(x)$ is the basis function mapping x into the space spanned by the new basis. The order of the model, which in turn governs the complexity, is defined by m. The zeroth term is a column vector of ones, serving as a bias term for the model.

We want to find the w that minimizes the sum of squared errors as defined by:

$$w^* = \underset{\omega}{\operatorname{argmin}} \sum_{i=1}^{n} (y_i - \hat{y}_i)^2 \quad (6)$$

Ridge regression, also known as Tikhonov regularization [Wikipedia. Tikhonov regularization (viewed Apr. 30, 2009). http://en.wikipedia.org/wiki/Ridge_regression.], solves this problem by adding a regularization term and resulting in the following formula for the solution:

$$w_{ridge} = (\phi(x)^T \phi(x) + \lambda I)^{-1} \phi(x)^T y \quad (7)$$

where λ is a penalty term ensuring that the w's in the solution remain close to zero. Once we compute the solution, we can store the vector w as a surrogate for the whole transient. Note that w is m-dimensional and typically we choose m<<n.

Three different basis functions were used, and are described below:
Polynomial:

$$\phi_i(x) = x^i \quad (8)$$

Gaussian Radial Basis Functions (RBF):

$$\phi_i(x) = \exp\left(-\frac{(x - u_j)^2}{2s^2}\right) \quad (9)$$

In our implementation, we selected the centers ($u_j$) by distributing them uniformly, and the scale factor s was fixed to 5.

Fourier Basis Functions:

$$\phi_{odd(i)}(x) = \sin\left(\frac{2\pi i}{T} x\right) \quad (10)$$

$$\phi_{even(i)}(x) = \cos\left(\frac{2\pi i}{T} x\right) \quad (11)$$

The number of elements in the basis transformation matrix was doubled for this last function, since it requires one sine and one cosine term for each i.

3.5 Classifying Events (56)

Now that we have a way of describing the events, we can proceed to automatically recognize the appliance state transition that most likely caused it. Various supervised learning algorithms, specifically classification algorithms can and have been applied to this problem, as evidenced in the literature survey presented earlier.

In a supervised learning setting, a set of labeled examples (e.g., a feature vector for the turn-on of a refrigerator) is presented to the algorithm during a training phase. New, unlabeled events can later be presented to the trained algorithm for it to provide a predicted label. Using a dataset containing close to 500 transients of 17 different appliances in a residential building, we compared the accuracy of a handful of these algorithms: Gaussian Naïve Bayes (GNB) [Tom Mitchell. Generative and Discriminative Classifiers: Naive Bayes and Logistic Regression. World Wide Web, September 2005.], Decision Trees (DT) [Thomas Mitchell. Machine Learning. McGraw Hill Higher Education, 1st edition, October 1997] and k-Nearest Neighbors (k-NN) [Christopher M. Bishop. Pattern Recognition and Machine Learning. Springer, 1 edition, October 2007.]. The best results were obtained using the 1-Nearest Neighbor algorithm. The average 10-fold cross validation accuracy for this classifier, when using a set of RBF coefficients as the features (f=3, α=51, β=41) was 81% with a training set and 77% with a validation set.

These global accuracy rates are not very meaningful unless one inspects the specific rates for individual appliance state transitions. The task of these classifiers was to assign one out of the 44 possible classes (appliance state transitions) present in the dataset, to every feature vector presented to it. Table 1 shows the F-1 scores for some appliance state transitions sorted by their change in steady-state power. The validation set consisted of a single example of each class, which may explain why some transitions have a F-1 score of zero during validation. Also worth noting is that transitions are not equally represented in the training set, with some only having two examples. This last fact can explain some of the zero F-1 scores during training. The most important observation, however, is that for most of the large loads, the accuracy rates are relatively high, which means the approach works well on the loads that constitute the largest portion of the total energy consumed in the building.

TABLE 1

F-1 scores for a subset of the appliance state
transitions tested in our prototype system.

| Appliance | State Transition | Approx Power (Watts) | Training F-1 | Validation F-1 |
|---|---|---|---|---|
| Fan | Medium - high | 3 | 100% | 100% |
| Fan | High - medium | −3 | 100% | 100% |
| Fan | Low - medium | 5 | 100% | 100% |
| Fan | Medium - low | −5 | 100% | 100% |
| Overhead Light A | On - off | 10 | 67% | 100% |
| Overhead Light A | Off - on | 10 | 100% | 67% |
| Desk Light | Off - on | 15 | 50% | 67% |
| Desk Light | On - off | 15 | 0% | 0% |
| Air Purifier | Medium - low | −25 | 100% | 100% |
| Air Purifier | Low - medium | 25 | 100% | 100% |
| Overhead Light D | Off - on | 30 | 100% | 100% |
| Overhead Light D | On - off | −30 | 0% | 0% |
| Fan | Off - high | 40 | 100% | 100% |
| Fan | High - off | −40 | 0% | 0% |
| Electric Kettle | Off - on | 500 | 0% | 0% |
| Electric Kettle | On - off | −500 | 100% | 100% |
| Stove (Small Burner) | Off - Medium | 570 | 100% | 100% |
| Stove (Small Burner) | Medium - Off | −570 | 100% | 100% |
| Stove (Large Burner) | Medium - Off | −870 | 67% | 67% |
| Stove (Large Burner) | Off - Medium | 870 | 0% | 0% |
| Toaster | Off - on | 1500 | 100% | 67% |
| Toaster | On - off | −1500 | 100% | 100% |
| Heating System | Fan - off | −2000 | 100% | 100% |
| Heating System | Off - Fan | 2000 | 100% | 100% |
| Heating System | Heating - off | −14000 | 100% | 100% |
| Heating System | Off - Heating | 14000 | 100% | 100% |

These findings, although promising, are based on a very small dataset with a poor representation of certain appliances. Larger collections of examples are being generated with more automated ways of training by using plug-level wireless power meters to unambiguously determine when an appliance changes its state and consequently notify the main NILM algorithm about this occurrence (with a time-stamp and a label). This last method allows for the collection of a larger number of ground-truth examples.

Figure 16:
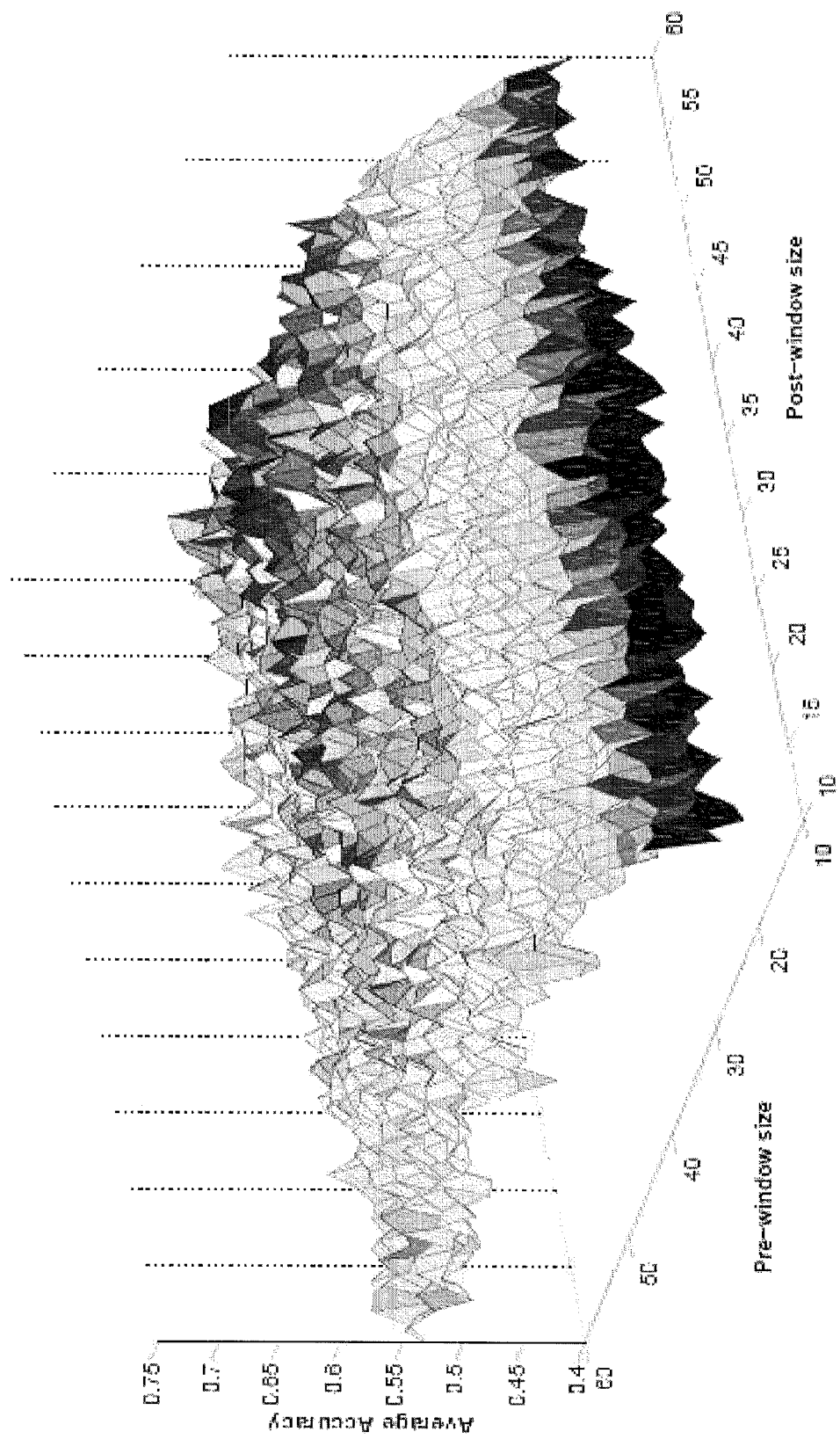
FIG. 16 illustrates average 10-fold cross validation accuracy using 1-NN classifier and the whole transient as a feature vector, for different values of pre- and post-window sizes.

Now that we have shown how to evaluate the accuracy of the disaggregation algorithms, we can discuss how the parameters used during feature selection can affect the performance of the classifiers. Specifically, we will show how we arrived at the fixed window size we are using to capture the transients. FIG. 16 shows how the 10-fold cross validation accuracy of the 1-NN classifier varies with respect to the number of samples used to characterize the transients. These accuracies are with respect to the set of training examples. We allowed the window to vary in two dimensions, namely the number of samples before the event ($\beta$), and the number of samples after ($\alpha$). It is easy to see that a careless selection of these parameters can result in a very poor accuracy.

3.6 Beyond Disaggregation: Signature Database (210) and Training

The previous sections have explained in detail a set of processes for obtaining individual appliance state changes from the aggregate power-metrics time-series F[i], by implementing modified versions of the techniques present in the NILM literature. To ensure the technology can be of use to building owners and other interested parties, a number of questions remain to be answered. For example, how well would the system perform initially, once deployed for the first time in a building? How would it improve its performance?

The signature database 210 is central to answering these questions. Using the algorithms we just described, initially, the prototype system described here will begin to match feature vectors with the most likely candidate in the signature database 210. If a signature of the correct state transition is not already in the database 210, then there are two possible outcomes: (a) the database 210 is empty and no match will be made; or (b) the most likely candidate signature will be used as a match, where the likeliness can be assessed in a number of different ways. If using k-NN, a distance metric can be computed to evaluate the proximity of two signatures and then decide whether or not it is a close match. A simple Euclidean distance may be used, while other more robust metrics such as the Mahalanobis distance [Wikipedia. Mahalanobis distance (viewed May 1, 2009). http://en.wikipedia.org/wiki/Mahalanobis distance.] may be better suited for the problem.

New events that do not have a close signature in the database 210, will be stored and await for a label that could come from: (a) a human user, through an interface; (b) a device that may have direct knowledge of the appliance's behavior (e.g., a plug-through power meter connected to the appliance); or (c) an off-line run of the classification algorithm at a later time when it has been already trained on such signatures. Using this approach, the prototype system will slowly begin to improve its performance and reduce the uncertainty regarding the appliances that are present in a building.

Some researchers [Kwangduk Douglas Lee. Electric load information system based on non-intrusive power monitoring. Thesis, Massachusetts Institute of Technology, 2003. Thesis Ph. D.—Massachusetts Institute of Technology, Dept. of Mechanical Engineering, 2003] propose instead to perform an initial state estimation searching for the most likely combination of appliance states that would fit the power measurements when the system is first started. The process would be repeated every so often to correct errors. However, this approach assumes knowledge of the appliances that are present in the building, or at least a finite list of appliances that could possibly be there.

The present invention may be implemented as a middle-ground approach where the system 10 makes use of the general signature database when it has no knowledge about the appliances in the building, but can limit the search space when it knows of some appliances being present. To make the present invention work more efficiently, it may be embodied with a shared, distributed database of signatures to which all NILM systems can have access.

Specific details about how to design, populate and maintain such a database 210 will vary depending on the particular application of the present invention. However, the present invention will be described in more detail with regards to how appliance signatures can be shared across different implementations of the framework, in different buildings. In addition, the present invention will be described in terms of how an approach like this would scale up to include many (possibly millions) different signatures. By storing additional information about the system's configuration (e.g., sampling rate, appliance type, etc.) along with each appliance signature, the present invention may be used to create an appliance signature repository that would enable other systems to compare signatures and obtain close matches while avoiding possible confusions due to differences between the system configurations. Additionally, the repository may be centrally localized or distributed across different locations, and provide a common interface to access the database from a network connection much as the way Gracenote's MusicID® (http://www.cddb.com/business_solutions/music_id/) allows users to both download and upload music files metadata, which can then be associated with the unique audio "fingerprint" for each music file.

4 Low-Resolution Power Data

So far the results we have shown were obtained from a 20 Hz continuous stream of F[i] values, where the F[i] include real and reactive power metrics. Most likely, custom hardware and/or software will be needed to obtain these data in any building. In this section, we describe embodiments of the invention that address the question: how much can we do with lower-resolution power data, such as what is expected to become available from the new generation of utility "smart" meters?

4.1 Down-Sampling: How Much is Enough?

Figure 17:
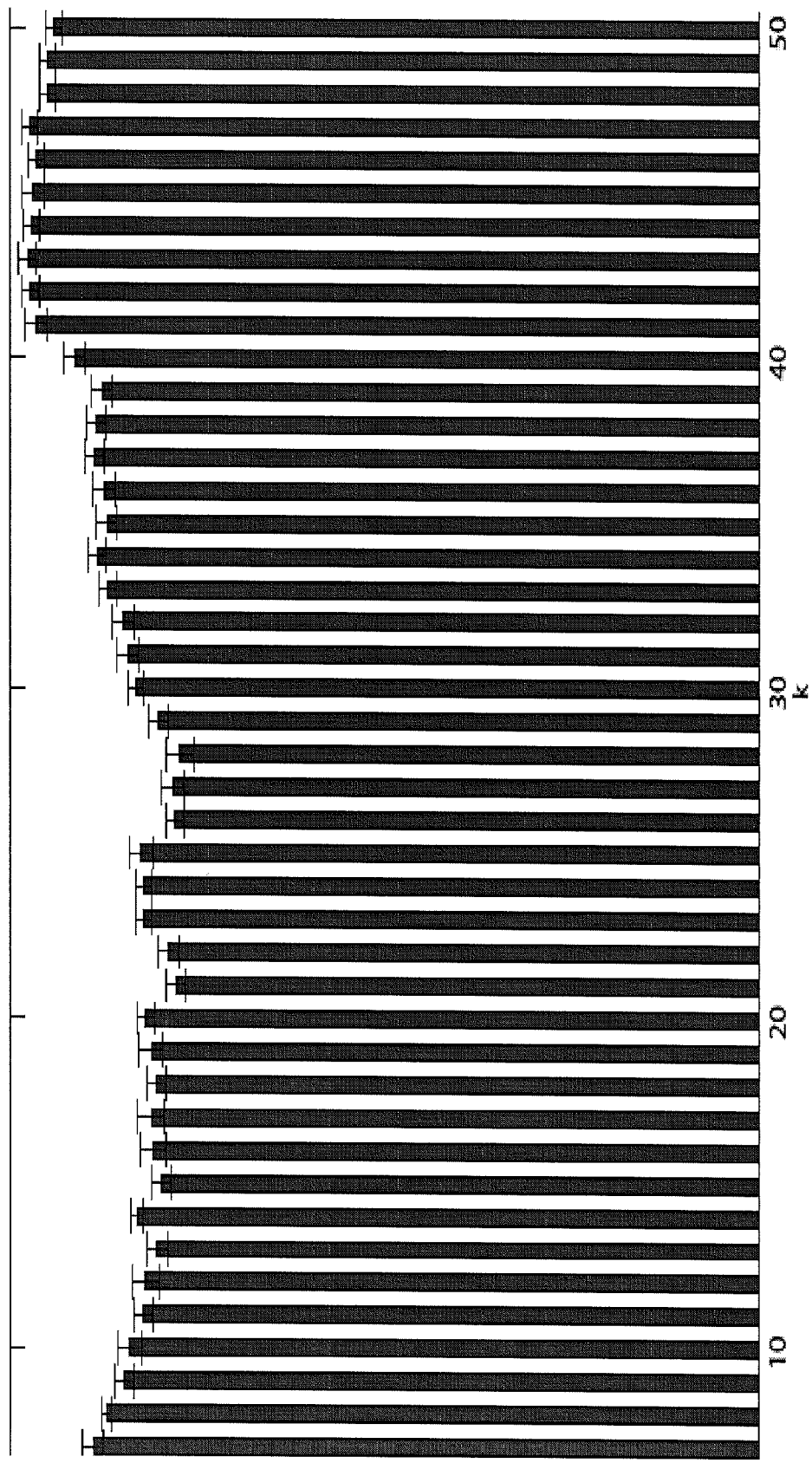
FIG. 17 illustrates average overall mean accuracy and standard deviation versus downsampling factor.

Using the data we obtained with our prototype system, preliminary experiments were performed to test these ideas. We down-sampled the transient profiles (F[i]) and retested these using the same feature extraction and classification algorithms. We used two different methods for down-sampling. In the first, we simply take every k samples of the original signal. Given that there are k possible starting points, this approach resulted in k different down-sampled transients for full-resolution one. Our second approach was a windowed-averaging filter. We obtained the average of every k samples, resulting again in k down-sampled transient for each full-resolution one. FIG. 17 shows the mean and standard deviation of the 10-fold cross validation accuracy values among the k down-sampled transients, for different values of k. Similar results were obtained using the non-averaged method.

The present invention may take many forms and embodiments. For example, the present invention has been described as working on the full resolution data in order to detect the precise moment in time when there is change in the mean/variance of the power signal. However, in some embodiments lower-resolution data may be used by the event detector.

It is conceivable that, although the linear regression coefficients we have been using are well suited to handle this lower-resolution transients, there may be other features of the signal that better capture the distinctive characteristics of each transient.

5 Leveraging Other Data Sources

In previous sections, we have described extensions that make the framework more general and easier to apply to any arbitrary building. By enabling the sharing of appliance signatures, we facilitate an economy of plentitude [Kevin Kelly. New Rules for the New Economy. Penguin (Non-Classics), October 1999], where the more NILM systems are networked together, the more valuable each of them are. Similarly, when adapting the techniques to work with lower-resolution power data, we are generalizing the approach and making it applicable to more facilities. In this section, we explore an extension that is aimed at making use of the specific differences present in each building. We are going to explore how to use non-electricity data sources to infer appliance behavior, and such sources are different in each building.

5.1 Available Data Sources

There are a number of different phenomena in a building that either directly or indirectly capture information about the behavior of electrical appliances in it. In previous sections we explored the direct source: the electricity distribution system. Now we will present a list of the indirect ones. It is by no means an exhaustive list; however, it will serve as an illustration of the breadth of the possible data sources, and the costs associated with obtaining each of them.

5.1.1 Indirect Measurements

The electric energy that appliances draw from the grid is always transformed into another form of energy and, in many cases, it is possible to measure this second form to infer the operational status of the appliance. Room temperature, for example, can be a proxy for the operation of the HVAC system, even though many other factors affect this variable (e.g., windows, people, etc.). Along the same line there are other similar environmental phenomena which can be monitored: light intensity levels, motion, room occupancy status, $CO_2$ levels, sound level, etc. Even photographic images of certain building locations could be analyzed to determine the status of appliances.

There are other indirect information sources which cannot be directly classified as an effect of the transformation of energy. For example, a room scheduling database has information about the possible occupancy state of rooms in a building which could inform estimations about the usage of appliances in those spaces. The resources consumed by some appliances during their operation could also be monitored. For instance, high water consumption in the building may be an indication of the operation of the washing machine or the dishwasher. Similarly, the bandwidth usage in computer networks, especially as reported by wireless access points, could indicate a person is using a computer in the vicinity.

5.2 Integrating these Sources into the Framework

In some embodiments the present invention will need to overcome the time-synchronization and meta-data issues discussed earlier in section 2.4. This will help to understand the nature of the incoming data and its relationship to the standard F[i] power measurements. Following this, these embodiments will utilize a similar process to the one used with electricity data: event detection, feature extraction and pattern recognition; with the goal of extracting a meaningful label for any event that takes place in the signal. Although these steps are in high-level terms the same, the implementation will necessarily be different. The signatures for these type of data will be stored locally (one database for each building) and separated from the power signatures.

6 Multi-Modal Distributed Non-Intrusive Load Monitoring: The Framework

We have discussed the details of several different embodiments according to the present invention. The present invention will now be described in terms of a combination of the ideas into a single unifying framework. In particular, we will combine a distributed signature database, methods for leveraging low-resolution data, and techniques for incorporating different sensor streams.

6.1 Multi-Modal Distributed Non-Intrusive Load Monitoring Embodiment

Figure 18:
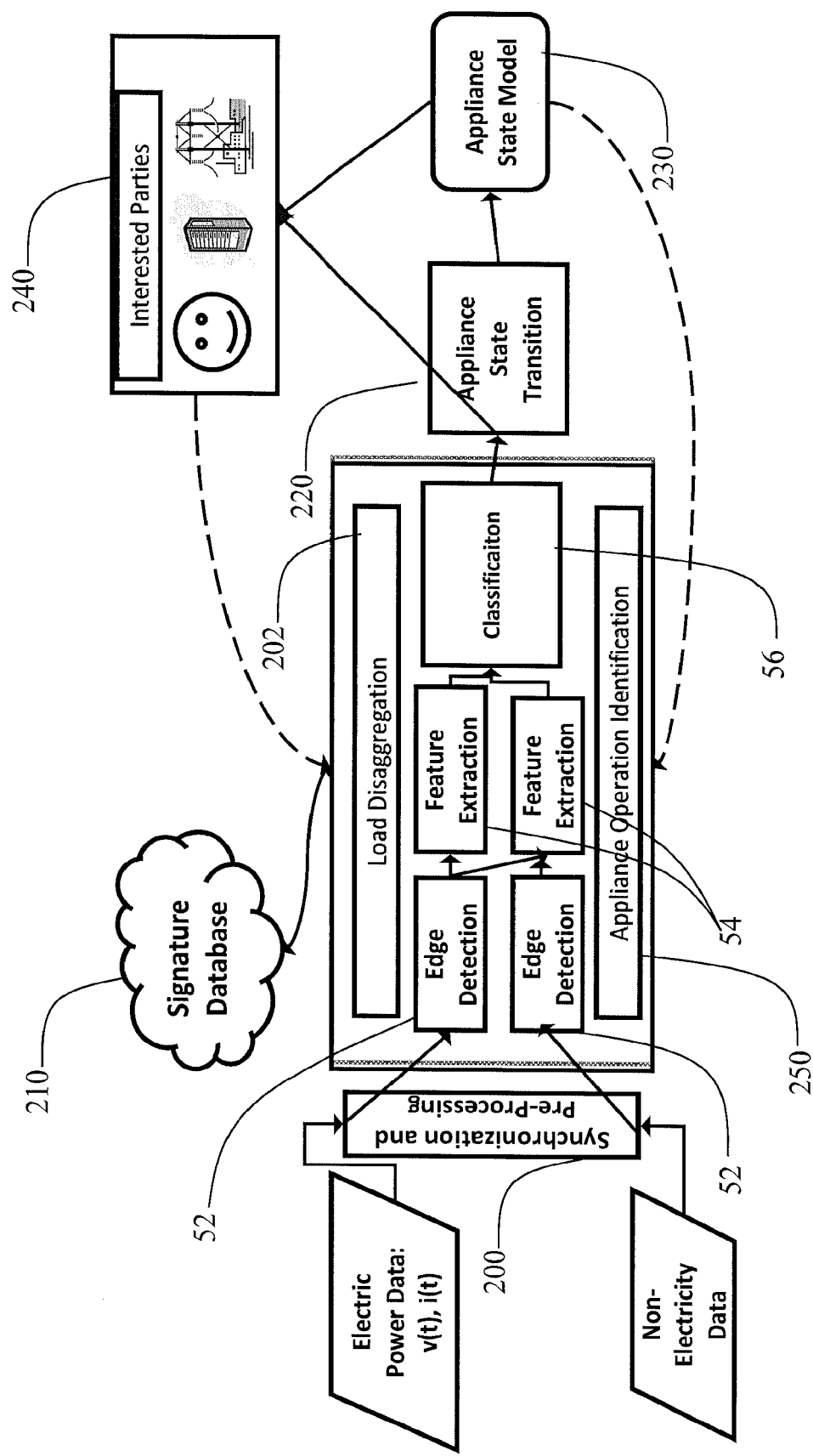
FIG. 18 is an extended block-diagram depicting the parallel processes used to extract information from the different sources of information: the power distribution system and other sensors.

FIG. 18 shows one embodiment of a proposed MOD-NILM framework. In contrast with the previous block-diagram, we can first see that there are now two parallel processes between the pre-processing stage 200 and the arbitrator 56. Each of these parallel tracks deals with the different input sources in the same way: events are detected 52, then features are extracted 54 from the samples surrounding them, and lastly a pattern recognition algorithm classifies 56 them. However, as it was discussed before, the implementation of these sub-processes will be different.

The load disaggregation track 202, outputs an appliance state transition, along with a time-stamp for when it thinks it occurred. Similarly, the Appliance Operation Identification track 250 produces an estimate of the current operating mode of an appliance, also accompanied by a time-stamp. This output will not necessarily be coupled to the detection of an event in the non-electricity source. It may be triggered by an event detected in the power-series.

Secondly, the output of these processes now goes to an arbitrator 56, which has the responsibility of merging the information provided by each and arriving at a conclusion about the operational status of the appliances. The result is used to update the appliance state model, just as it was done in the diagram shown earlier. Also worth noticing is that the pre-processing stage 200 is now also responsible for synchronizing the incoming signals. In addition to that, in this step of the framework we extract the necessary meta-data for describing the nature of the signals.

6.2 Performance Metrics

Many metrics may be used to test and validate the present invention. For example, systems deployed in occupied buildings may be used to evaluate the following performance metrics:

1. Percentage of the total load in the building that can be disaggregated at the end of the study.
2. Time it takes for the system to achieve 80% disaggregation of the total load.

Other metrics may also be used.

7 Expected Contributions

One contribution of the present invention is a framework for obtaining disaggregated, appliance-specific feedback about electricity consumption in a building by extracting high-value information from low-cost data sources. We achieve this goal by taking a systems integration approach to the problem. Instead of being limited to electric power data or a fully autonomous solution that does not require user intervention, the present invention may leverage different resources already present in modern buildings (this includes owners and managers).

Specific contributions of the present invention are: (1) a methodology for utilizing a common appliance signature database that can distribute the training process required for NILM systems, and can understand the semantics in order to deal with signatures obtained through different processes; (2) user-interactive training that enables labeling and recognition of new or unknown devices as well as updates of online or local repositories with such device signatures; (3) device classification algorithms that require a reduced sampling rate while still capturing major appliance loads so that hardware costs are lowered or removed altogether by leveraging utility "smart meters" that are already in place; and (4) a method for incorporating non-power measurements into the framework in order to improve the performance.

In general, the present invention provides for the monitoring and control of future energy systems. The present invention spans the disciplines of engineering and computer science, providing contributions on both ends. Furthermore, the problem encompasses challenges in the physical domain, such as understanding the relationships between electricity consumption, electrical loads in buildings and human behavior; as well as challenges in the cyber-domain such as sensor-fusion and machine learning techniques for performing inferences about the state of electrical appliances and discovering knowledge in datasets of energy consumption.

Although the present invention has generally been described in terms of specific embodiments and implementations, it is not limited thereto. The examples provided herein are illustrative, and other variations and modifications of the present invention are possible and contemplated. The foregoing specification and the following claims are intended to cover all such modifications and variations.

The invention claimed is:

1. A method, comprising:
    acquiring (50) a signal indicative of power consumption;
    detecting (52) a transient in the signal;
    extracting (54) a feature indicative of the transient, wherein extracting the feature includes:
        fitting (60) a plurality of models to the transient;
        selecting (62) one of the plurality of models as a model for the transient;
        defining (64) the feature indicative of the transient based on at least one parameter of the model for the transient; and
    classifying (56) the transient based on the feature.

2. The method of claim 1, further comprising after detecting a transient in the signal:
    prompting (70) the user to identify the transient with an electrical device;
    receiving (72) input from the user indicative of an identity of the transient;
    classifying (74) the transient based on the input from the user.

3. The method of claim 1, wherein fitting (60) the plurality of models to the transient includes performing a regression of the transient.

4. The method of claim 1, wherein detecting (52) the transient includes:
    defining (80) a window in the signal, wherein the window is less than all of the signal;
    calculating (82) a likelihood ratio for each of a plurality of points within the window; and
    identifying (84) a point within the window having a maximum likelihood ratio.

5. The method of claim 4, wherein calculating (82) the likelihood ratio includes:
    calculating (90) a change in mean power;
    setting (92) the likelihood ratio to zero if the change in mean power is less than a predetermined value.

6. The method of claim 4, further comprising after identifying (84) the point within the window having a maximum likelihood ratio:
    moving (100) the window relative to the signal;
    calculating (102) a likelihood ratio for each of a plurality of points within the window;
    identifying (104) a point within the window having a maximum likelihood ratio.

7. The method of claim 6, wherein the steps of moving (100) the window relative to the signal, calculating (102) the likelihood ratio, and identifying (104) the point having a maximum likelihood ratio are performed a plurality of times.

8. The method of claim 7, further comprising identifying (120) a transient if at least one point satisfies a predetermined condition based on the likelihood ratio.

9. The method of claim 8, wherein identifying (120) the transient includes identifying the transient if at least one point is identified as having a maximum likelihood ratio in more than a predetermined number of windows.

10. The method of claim 4, wherein the likelihood ratio is a ratio of the probability that the point is drawn from a Gaussian distribution with mean and variance computed from a window of a predetermined number of samples before and the probability that the point was drawn from a Gaussian with mean and variance computed from a window of a predetermined number of samples after.

11. The method of claim 4, wherein calculating (82) a likelihood ratio includes calculating:

$$vote_{index} = \operatorname*{argmax}_{n \in w^p} \sum_{j=n}^{k} l_j$$

wherein:

$$l_j = \ln\left[\frac{P(P_1[j] \mid \mu_{after}, \sigma_{after})}{P(P_1[j] \mid \mu_{before}, \sigma_{before})}\right]$$

n is the number of samples in the detection window;

$\mu_{after}$ and $\sigma_{after}$ are the sample mean and variance over the range [j+1, j+$w_a^l$+1] wherein $w_a^l$, is a predetermined number of samples after the current point in the test statistic window;

μbefore and σbefore are the sample mean and variance over the range [j−$w_b^l$−1,j−1], wherein $w_b^l$ is a predetermined number of samples before the current point in the test statistic window;

the length of the detection window, $w^e$, is $w_b^l$+$w_a^l$+1;

k is the last sample in the detection window $w^e$ $P(P_1[j] \mid \mu_{after}, \sigma_{after})$ is the probability that a sample $P_1[j]$ is drawn from a Gaussian distribution with mean and variance computed from a window of a predetermined number ($w_a^l$) of samples after j; and $P(P_1[j] \mid \mu_{before}, \sigma_{before})$ is the probability that the sample $P_1[j]$ was drawn from a Gaussian with mean and variance computed from a window of a predetermined number ($w_b^l$) of samples before j.

12. The method of claim 1, wherein:
acquiring (50) the signal includes acquiring a plurality of signals indicative of power consumption; and
the plurality of signals are selected from a group consisting of real power consumption, reactive power consumption, a harmonic of the real power consumption, a harmonic component of the reactive power consumption, current, and voltage.

13. A system (10), comprising:
a sensor (20);
an input device (16);
an output device (18);
a processor (12);
computer-readable memory (14) including computer-readable instructions which, when executed by the processor (12), cause the processor (12) to perform the steps of:
acquiring (50) a signal indicative of power consumption;
detecting (52) a transient in the signal;
extracting (54) a feature indicative of the transient, wherein extracting the feature includes:
fitting (60) a plurality of models to the transient;
selecting (62) one of the plurality of models as a model for the transient;
defining (64) the feature indicative of the transient based on at least one parameter of the model for the transient; and
classifying (56) the transient based on the feature.

14. The system (10) of claim 13, wherein the sensor (20) is a sensor of power consumption.

15. The system (10) of claim 13, further comprising an additional sensor (20) that does not sense power consumption.

16. The system (10) of claim 15, wherein the sensor (20) is selected from a group comprising a motion sensor, temperature sensor, acoustic sensor, light sensor, humidity sensor, oxygen level sensor, carbon dioxide sensor, radiation sensor, infrared sensor, pressure sensor, flow sensor electro-magnetic field sensor, and a particulates sensor.

17. The system (10) of claim 13, wherein the computer-readable instructions, when executed by the processor (12), cause the processor (12) to perform the following steps after detecting (52) the transient in the signal:
providing (70) a prompt on the output device (18), wherein the prompt requests a transient to be identified with an electrical device;
receiving (72) input at the input device (16); and
classifying (74) the transient based on the input.

18. The system (10) of claim 17, wherein providing (70) a prompt on the output device (18) includes identifying at least one electrical device that may correspond to the transient.

19. The system (10) of claim 17, wherein the providing (70) a prompt is performed immediately after the transient is detected.

20. The system (10) of claim 13, wherein the computer-readable instructions, when executed by the processor (12), cause the processor (12) to perform the following steps prior to detecting (52) the transient in the signal:
providing (70) a prompt on the output device (18), wherein the prompt requests electrical devices in the system to be identified;
receiving (72) input at the input device (16); wherein the input includes at least one electrical device in the system; and
storing (58) data in computer-readable form, wherein the data is representative of the at least one electrical device in the system.

21. The system (10) of claim 17, wherein detecting (52) the transient in the signal includes detecting a plurality of transients in the signal, and further comprising after detecting a plurality of transients in the signal:
separating (130) the transients into a plurality of groups, wherein each group includes transients having a common feature;
providing (70) a prompt on the output device (18), wherein the prompt requests the plurality of the transients having a common feature to be identified with an electrical device;
receiving (72) input at the input device (16); and
classifying (74) the plurality of the transients having a common feature based on the input.

22. The system (10) of claim 21, wherein providing (70) a prompt on the output device (18) includes providing a list of electrical devices that may correspond with the plurality of transients.

23. The system of claim 17, wherein classifying (56) the transient based on the feature includes comparing the feature indicative of the transient with computer-readable data indicative of known signatures of electrical devices, wherein the computer-readable data indicative of known signatures of electrical devices are stored in computer-readable memory (14).

* * * * *